(12) United States Patent
Tamaki et al.

(10) Patent No.: US 7,576,406 B2
(45) Date of Patent: Aug. 18, 2009

(54) SEMICONDUCTOR DEVICE

(75) Inventors: Yoichi Tamaki, Kokubunji (JP); Hideaki Nonami, Ome (JP); Masato Hamamoto, Iruma (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/773,658

(22) Filed: Feb. 9, 2004

(65) Prior Publication Data

US 2004/0183159 A1 Sep. 23, 2004

(30) Foreign Application Priority Data

Mar. 17, 2003 (JP) .......................... P2003-071942

(51) Int. Cl.
*H01L 29/00* (2006.01)

(52) U.S. Cl. .................. 257/526; 257/506; 257/565; 257/E29.171

(58) Field of Classification Search .............. 257/506, 257/526, 565, E29.171
See application file for complete search history.

(56) References Cited

U.S. PATENT DOCUMENTS

| 4,948,748 A | * | 8/1990 | Kitahara et al. | ............. 438/405 |
| 5,374,844 A | * | 12/1994 | Moyer | ........................ 257/582 |
| 5,508,550 A | * | 4/1996 | Morishita et al. | ........... 257/378 |
| 6,300,669 B1 | * | 10/2001 | Kinoshita | .................... 257/566 |

FOREIGN PATENT DOCUMENTS

| JP | 10-173040 | 6/1998 |
| JP | 2002-57219 | 2/2002 |
| JP | 2002-299466 | 10/2002 |

* cited by examiner

*Primary Examiner*—Long Pham
(74) *Attorney, Agent, or Firm*—Miles & Stockbridge P.C.

(57) ABSTRACT

A plurality of the same kind of npn-type bipolar transistors are disposed regularly on a semiconductor layer that is provided over an insulation layer. The plurality of unit bipolar transistors are connected in parallel, thereby to form a plurality of desired bipolar transistors. A deep trench isolation surrounds a group of or the whole of the plurality of unit bipolar transistors that are connected in parallel, for a plurality of desired bipolar transistor that require thermal stability.

18 Claims, 24 Drawing Sheets

SEMICONDUCTOR DEVICE

TECHNICAL FIELD OF THE INVENTION

The present invention relates to a semiconductor device technique. Particularly, the invention relates to a technique that is effective for application to a semiconductor device having a bipolar transistor provided on an SOI (silicon on insulator) substrate.

BACKGROUND OF THE INVENTION

The present inventors examined a method of forming one bipolar transistor of a large current by connecting a plurality of small bipolar transistors in series for a semiconductor device. According to this method, many kinds of large-current bipolar transistors can be formed easily while maintaining high performance of the bipolar transistors. The plurality of small bipolar transistors are disposed on a semiconductor layer to form an element that is provided on an insulation layer of the SOI substrate. Each of the small bipolar transistors is surrounded with an isolation.

Japanese Patent Application Laid-open Publication No. 10-173040 discloses the following configuration, for example. A U-trench isolation surrounds each of bipolar transistors having a common collector. Each silicon island surrounded with the U-trench isolation is comprised of a collector of each bipolar transistor, thereby to make it possible to change a collector potential.

Japanese Patent Application Laid-open Publication No. 2002-57219 discloses a configuration having a separator formed in an isolation region that isolates a semiconductor element in a saturation state from a semiconductor element that is not in a saturation state, thereby to avoid mutual move of charges.

SUMMARY OF THE INVENTION

The present inventors find that the technique of surrounding each of the plurality of small bipolar transistors with an isolation has the following problems.

When configuring a bipolar transistor with small bipolar transistors to flow large current, the surrounding of each small bipolar transistor with the isolation provides a complete isolation of elements. However, the isolation is formed with an insulation film of low thermal conductivity. Further, the semiconductor substrate cannot have a small thickness to improve heat radiation because of the structure of the substrate. Therefore, each small bipolar transistor generates a high temperature, which overheats locally. When the temperature becomes not uniform between the small bipolar transistors that are connected in parallel, this unevenness has a risk of generating an overheating.

It is an object of the present invention to provide a technique capable of improving thermal stability during the operation of a semiconductor device.

The above and other objects and novelty of the present invention will become clear from the description of the specification and accompanying drawings.

A representative outline of the disclosed invention is briefly explained as follows.

According to the present invention, an isolation surrounds a group of or the whole of a plurality of the same kind of unit bipolar transistors that are disposed on a semiconductor layer on an insulation layer in a state that the bipolar transistors are connected in parallel.

BRIEF DESCRIPTIONS OF THE DRAWINGS

DESCRIPTION OF THE PREFERRED EMBODIMENTS

Figure 1:
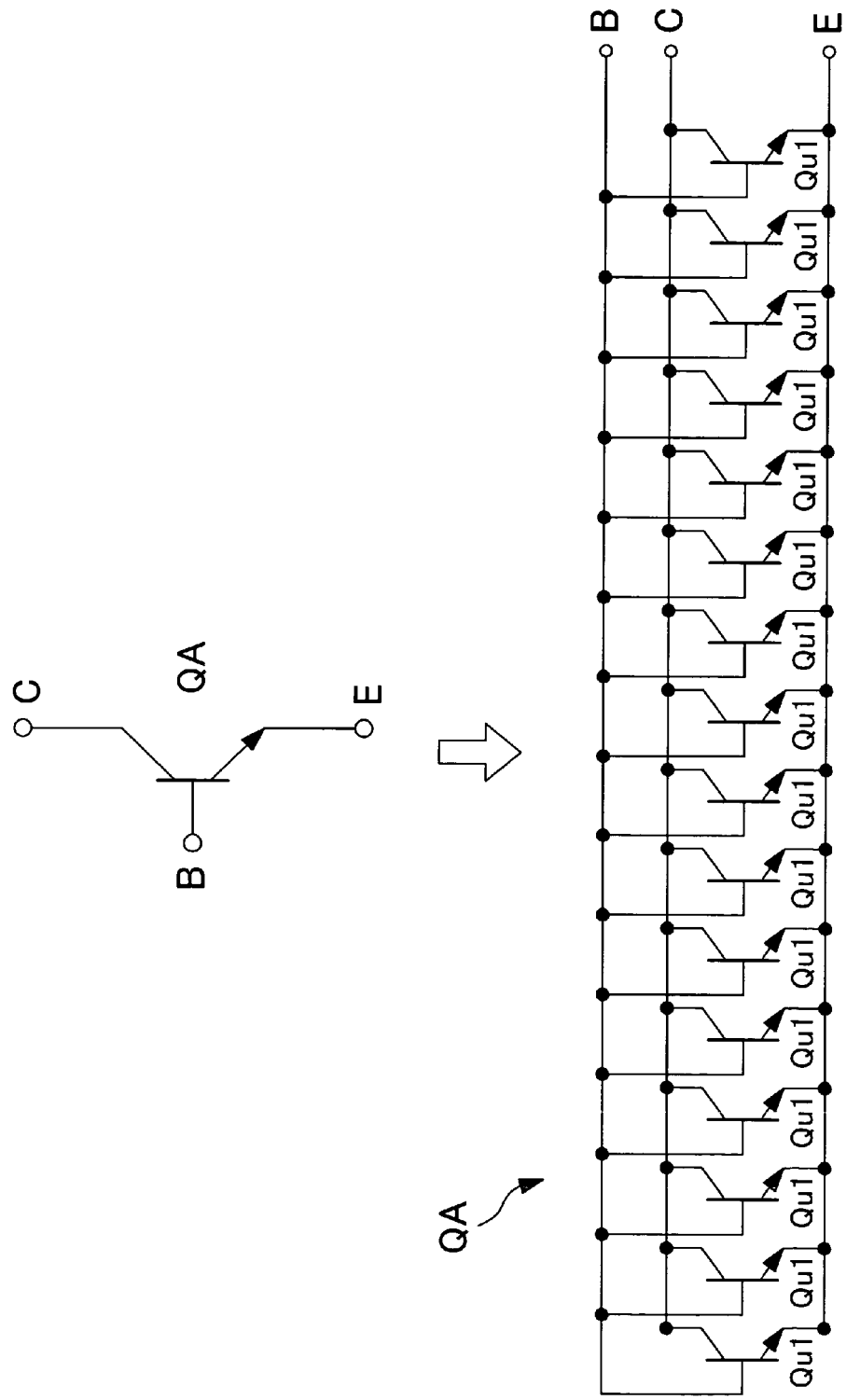
FIG. 1 is a circuit diagram that explains about a method of forming a bipolar transistor that constitutes a semiconductor device according to one embodiment of the present invention.

Before explaining in detail the embodiments of the present invention, meanings of terms used in the embodiments will be explained.

1. SOI (silicon on insulator) refers to a semiconductor substrate having a semiconductor layer provided on an insulation layer. An integrated circuit element is formed on this semiconductor layer. A general structure is that the semiconductor layer is provided over a supporting substrate via the insulation layer. In the embodiments of the present invention, SOI also includes a structure that the semiconductor layer is directly provided on a sapphire substrate or a spinel substrate.

2. The same kind of bipolar transistors refers to the bipolar transistors of basically the same conductivity and the one through which the same quantity of current can flow. In other words, the same kind of bipolar transistors refers to the bipolar transistors having the same conductivity and the same optimum current value. The optimum current value refers to a collector current value when the transistor frequency (i.e., a current gain band) ft of the bipolar transistor is in an optimum range. In general, this is a collector current value icmax when the transistor frequency ft becomes maximum. A permissible maximum current value is prescribed as one of circuit design standards. The current changes depending on the radiation characteristic, and is about one to two times the optimum current value (the current becomes higher when the radiation characteristic is better). Structurally, when the bipolar transistors have the same emitter width and the same emitter length, these bipolar transistors are generally regarded as the same kind of bipolar transistors. When there are a plurality of emitters, the bipolar transistors having the same emitter width, the same emitter length, and the same number of emitters are generally regarded as the same kind of bipolar transistors.

In the following embodiments, the embodiments are explained by dividing them into a plurality of sections or a plurality of embodiments when necessary. Except where specified otherwise, they are mutually not irrelevant, and are in the relationship of a modification, details, and complementary explanation of one or the other embodiment. In the following embodiments, when a number of elements (including number, numerical value, quantity, and range) is referred to, the number is not limited to a specific number, except where the number is clearly identified or where the number is clearly limited to a specific number based on the principle. The number may be equal to or above or below a specific number. In the following embodiments, it is needless to mention that constituent elements (including element steps) are not always essential except where they are clearly identified or where they are considered essential based on the principle. In the following embodiments, when shapes and positions of the constituent elements are referred to, shapes that are substantially approximate to or similar to these shapes are included except where the shapes are clearly identified or where the shapes are clearly considered not the same in principle. This similarly applies to the numerical values and ranges. Portions that have the same functions in the whole drawings to explain the embodiments are assigned with like reference numerals, and their repeated explanation will be omitted. A MISFET (Metal Insulator Semiconductor Field Effect Transistor) that represents a field-effect transistor is abbreviated as MIS. A MISFET of a p-channel type is abbreviated as pMIS, and a MISFET of an n-channel type is abbreviated as nMIS. A bipolar transistor is simply referred to as a transistor.

The embodiments of the present invention will be explained in detail with reference to the drawings.

First Embodiment

FIG. 1 is a circuit diagram that explains about a method of forming a bipolar transistor that constitutes a semiconductor device according to the present embodiment. In the first embodiment, a desired npn-type unit transistor QA is formed based on a parallel connection of a plurality of the same kind of npn-type unit transistors Qu1. According to this method, many kinds of transistors can be formed while maintaining high performance. As it is not necessary to prepare many kinds of transistors in a cell library, a semiconductor device can be designed easily. A reference symbol C denotes a collector electrode, B denotes a base electrode, and E denotes an emitter electrode. While FIG. 1 illustrates the example of the npn-type unit transistor QA, a pnp-type unit transistor can also be provided in a similar manner.

Figure 2:
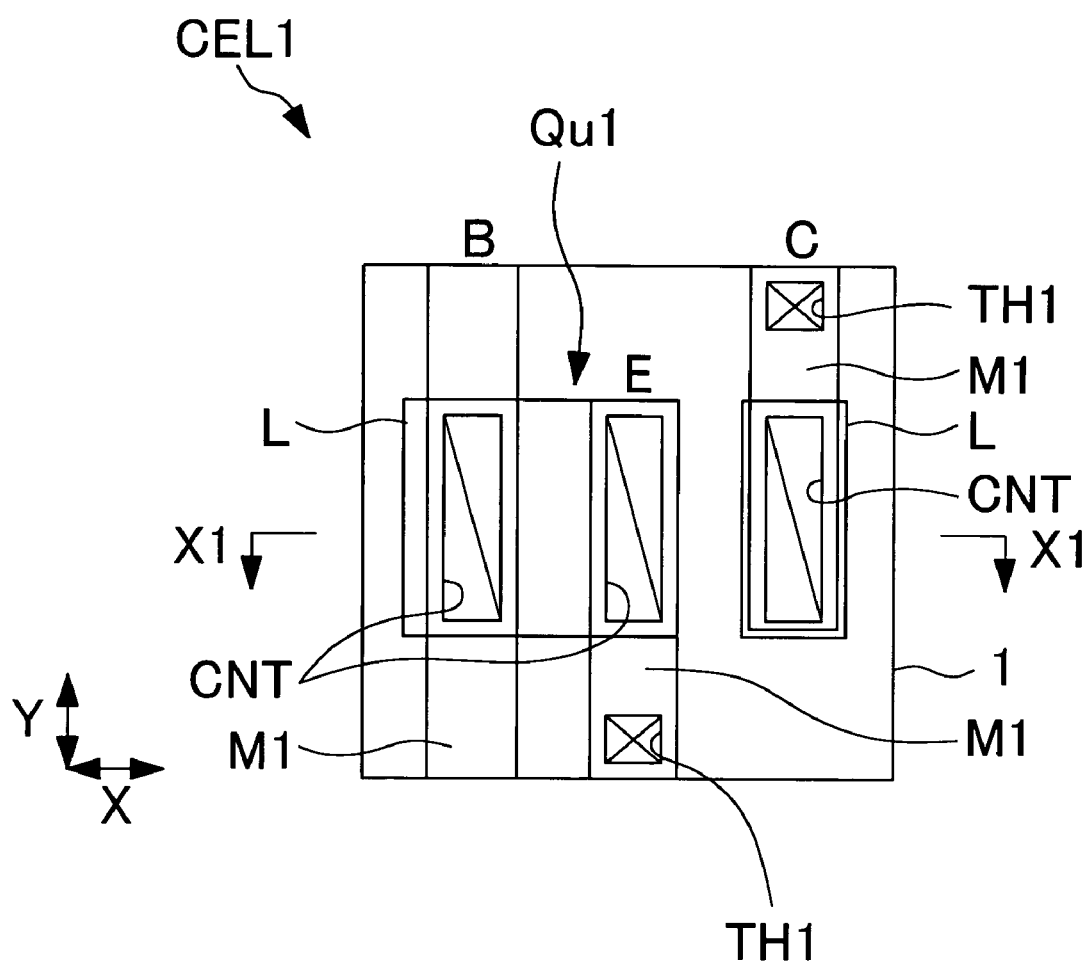
FIG. 2 is a top plan view illustrating one example of a cell of a unit bipolar transistor shown in FIG. 1.
Figure 3:
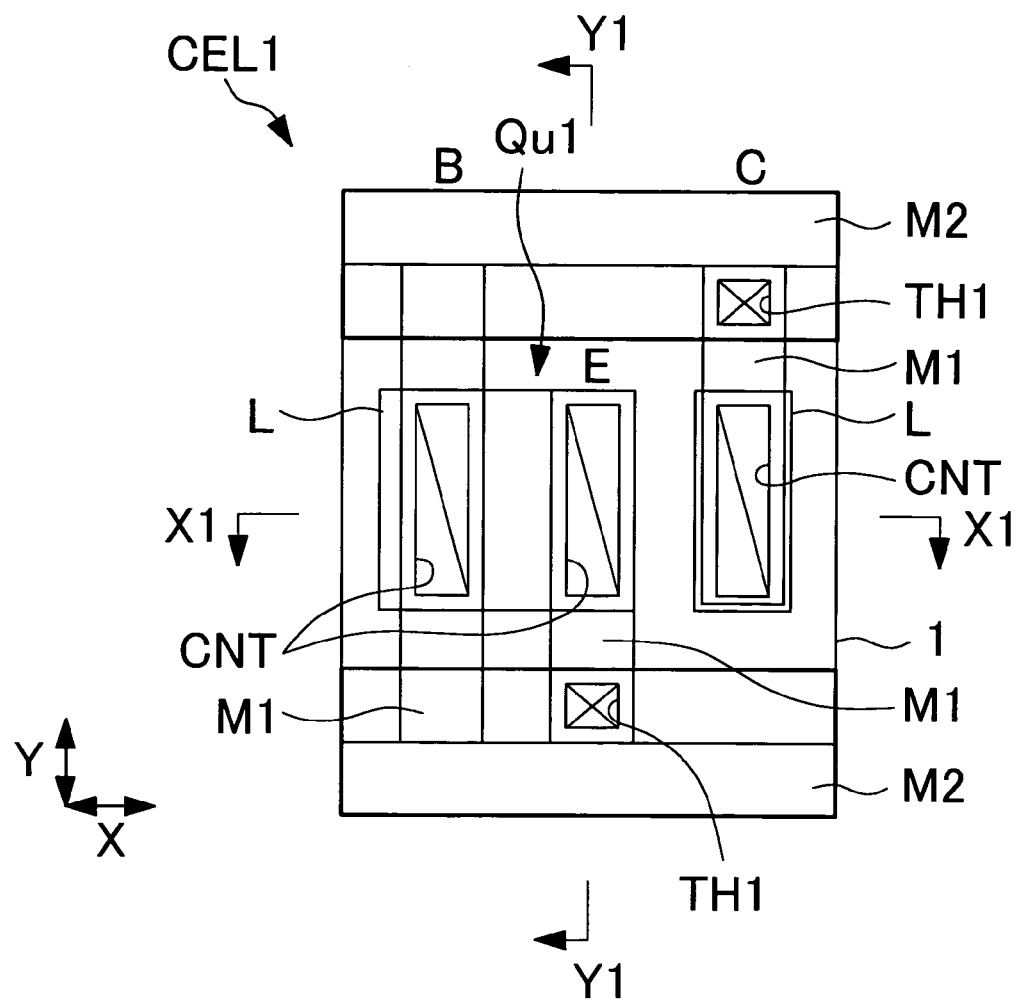
FIG. 3 is a top plan view illustrating one example of the cell of the unit bipolar transistor shown in FIG. 1, having a second layer wiring disposed in the configuration shown in FIG. 2.

A detailed example of a top plan view of the npn-type unit transistor Qu1 will be explained. FIG. 2 is a top plan view illustrating one example of a cell CEL1 of the npn-type unit bipolar transistor Qu1 shown in FIG. 1. FIG. 3 is a top plan view having a second layer wiring M2 disposed in the configuration shown in FIG. 2.

One large rectangular active region L and one small rectangular active region L are disposed in parallel on a main surface (i.e., a surface on which the device is formed) on a semiconductor substrate (hereinafter simply referred to as a substrate) 1, along the left and right directions (i.e., the X direction) in FIG. 2 and FIG. 3 respectively. Each active region L is also called an element formation region. A main region of the npn-type unit transistor Qu1 is formed in each active region L. In the large active region L, a base region and an emitter region described later are disposed along the X direction in a state that the long sides of these regions are opposite to each other. In the small active region L, a collector region described later is disposed in a state that the long side of the collector region faces the long side of the emitter region.

On the main surface of the substrate 1, three first layer wirings M1 are disposed. Each first layer wiring M1 is formed in a strip pattern to extend in the up and down directions (i.e., the Y direction) in FIG. 2 and FIG. 3. A contact hole CNT is disposed at a crossing portion between each of the three first layer wirings M1 and the active region L. Each first layer wiring M1, the base region, the emitter region, and the collector region are electrically connected to each other, through this contact hole CNT. Each first layer wiring M1 that is connected to the emitter region and the collector region is connected to an upper second layer wiring M2 through a thorough hole TH1. The second layer wiring M2 is formed in a strip pattern so as to extend along the X direction that crosses the extension direction of the first layer wiring M1.

Figure 4:
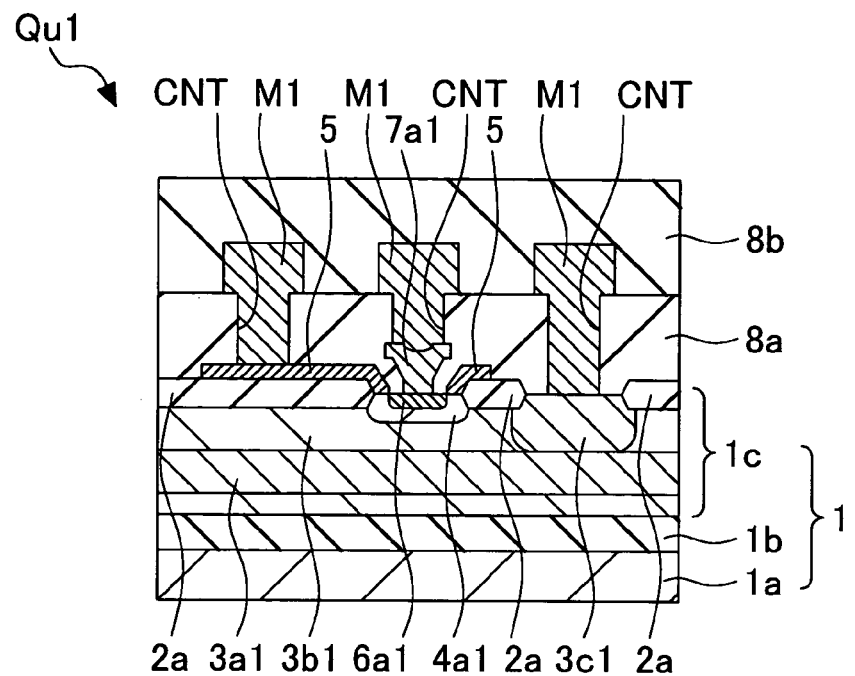
FIG. 4 is a cross-sectional view of the cell cut along a line X1-X1 in FIG. 2 and FIG. 3.
Figure 5:
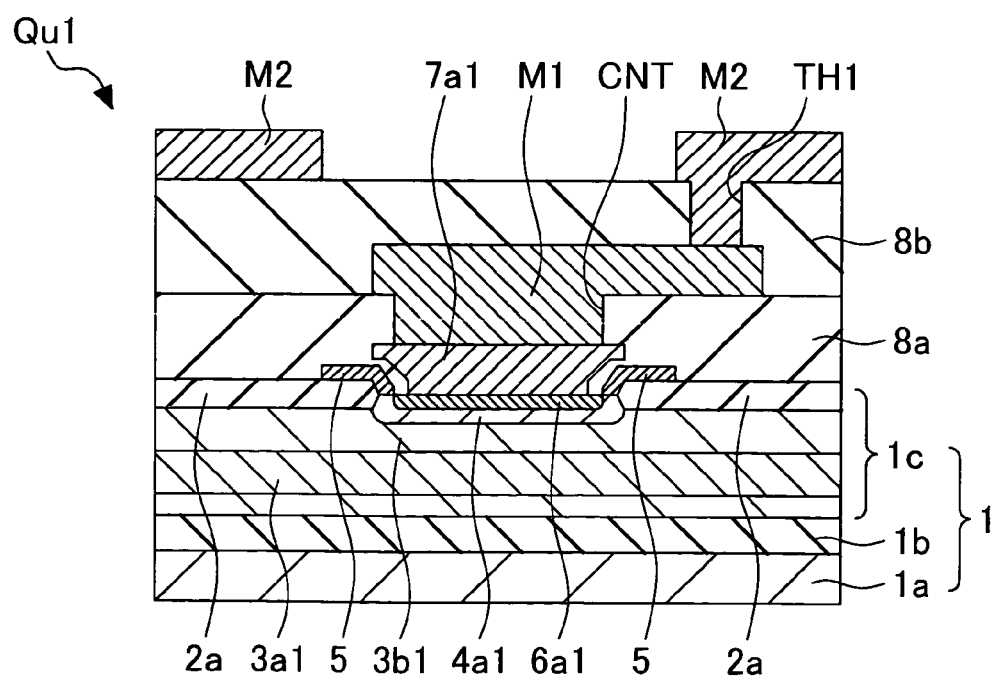
FIG. 5 is a cross-sectional view of the cell cut along a line Y1-Y1 in FIG. 3.

A detailed example of a longitudinal structure of the npn-type unit transistor Qu1 will be explained. FIG. 4 is a cross-sectional view of the cell cut along a line X1-X1 in FIG. 2 and FIG. 3, and FIG. 5 is a cross-sectional view of the cell cut along a line Y1-Y1 in FIG. 3.

The SOI substrate is used for the substrate 1, for example. In other words, the substrate 1 has a supporting substrate 1a, an insulation layer 1b that is formed on the supporting substrate 1a, and a semiconductor layer 1c that is formed on the insulation layer 1b. The supporting substrate 1a comprises an n-type monocrystalline silicon (Si), and has a function of securing mechanical strength of the SOI substrate 1. The insulation layer 1b comprises silicon dioxide ($SiO_2$) for example, and has a film thickness of about 0.2 to 0.5 μm. The semiconductor layer 1c comprises monocrystalline silicon, for example, and has the npn-type unit transistor Qu1 formed on the semiconductor layer 1c. FIG. 4 illustrates the high-performance npn-type unit transistor Qu1 having a two-layer polycrystalline silicon self-alignment type structure.

A shallow groove isolation 2a is formed on the main surface (i.e., a surface on which the device is formed) of the semiconductor layer 1c. The shallow groove isolation 2a is formed according to a LOCOS (Local Oxidization of Silicon) method. The bottom of this shallow groove isolation 2a does not reach the insulation layer 1b, the semiconductor layer 1c is left under the lower layer thereof. The shallow groove isolation 2a may not be formed according to the LOCOS method, but may be formed according to a shallow groove isolation (SGI). This shallow groove isolation can be formed by embedding an insulation film such as a silicon oxide film within a shallow groove that is provided on the main surface of the semiconductor layer 1c to a depth not reaching the insulation layer 1b.

An embedded collector region 3a1 is formed in the semiconductor layer 1c. This embedded collector region 3a1 contains Antimony (Sb), for example, and is formed in the $n^+$ type. A collector region 3b1 and a collector drawing region 3c1 are formed in the upper layer of the embedded collector region 3a1. The collector region 3b1 and the collector drawing region 3c1 contain phosphorous (P) or Arsenic (As), and are formed in the n type-and the $n^+$ type respectively. The shallow groove isolation 2a is provided between the collector region 3b1 and the collector drawing region 3c1. The collector region 3b1 and the collector drawing region 3c1 are electrically connected to each other in mutually low resistance state through the embedded collector region 3a1.

A base region 4a1 is formed on the upper layer of the collector region 3b1. The base region 4a1 contains Boron and is formed in the p type. One end of a base drawing electrode 5 comprised of p-type polycrystalline silicon, for example, is in contact with the base region 4a1 and is electrically connected to the base region 4a1. The other end of the base drawing electrode 5 is drawn and extended onto the shallow groove isolation 2a.

An emitter region 6a1 is formed on the upper layer of the base region 4a1. This emitter region 6a1 contains phosphorous or Arsenic, and is formed in the $n^+$ type. An emitter drawing electrode 7a1 comprised of n-type polycrystalline silicon, for example, is electrically connected to the emitter region 6a1. The base drawing electrode 5 is disposed on the external periphery of the emitter drawing electrode 7a1. The base drawing electrode 5 and the base electrode 5 are mutually insulated from each other.

The npn-type unit transistor Qu1 has an emitter width of about 0.3 μm, for example, and has an emitter length of about 10 μm, which crosses the emitter width. This emitter width is a minimum size that makes it possible to obtain satisfactory transistor characteristics in a predetermined product or according to the currently available technique. This size is smaller than a minimum processing size that can be obtained according to a photolithographic technique. The emitter length changes depending on collector current that the transistor requires.

An insulation film 8a comprised of a silicon oxide film, for example, is deposited on the semiconductor layer 1c and the shallow groove isolation 2a respectively. The first layer wiring M1 is formed on the insulation film 8a. The first layer wiring M1 is made of metal such as aluminum (Al) or aluminum alloy. The first layer wiring M1 for the base is electrically connected to the base drawing electrode 5 through the contact hole CNT. The first layer wiring M1 for the emitter is electrically connected to the emitter drawing electrode 7a1 through the contact hole CNT. The first layer wiring M1 for the collector is electrically connected to the collector drawing electrode 3c1 through the contact hole CNT. An insulation film 8b comprised of a silicon oxide film, for example, is deposited on the insulation film 8a. The second layer wiring M2 is formed on the insulation film 8b. The second layer wiring M2 is made of metal similar to that of the first layer wiring M1. The second layer wiring M2 is electrically connected to the lower first layer wiring M1 through the through hole TH1.

Figure 6:
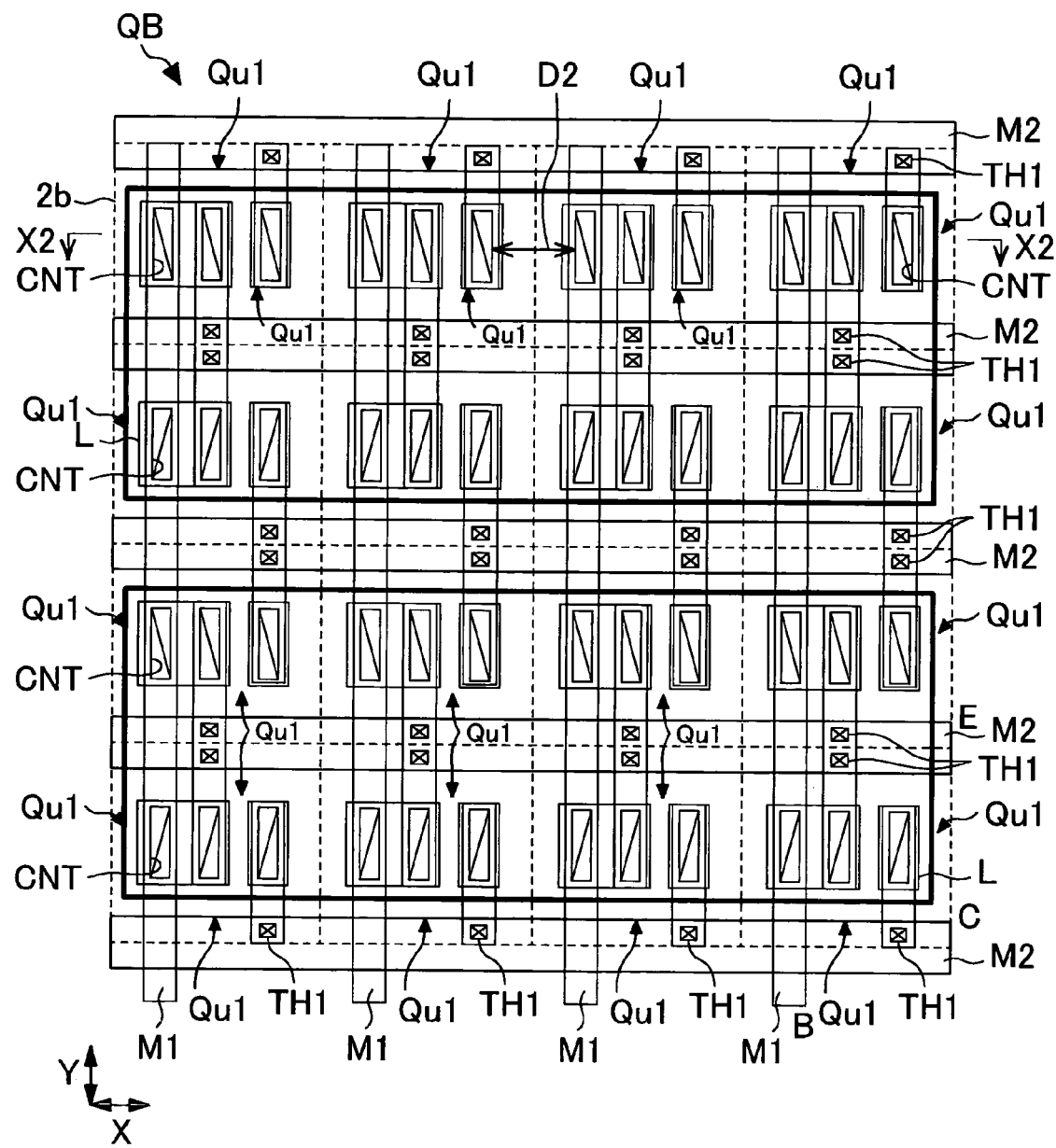
FIG. 6 is a top plan view of a key portion illustrating one example of a layout of the unit bipolar transistor shown in FIG. 2 and FIG. 3.
Figure 7:
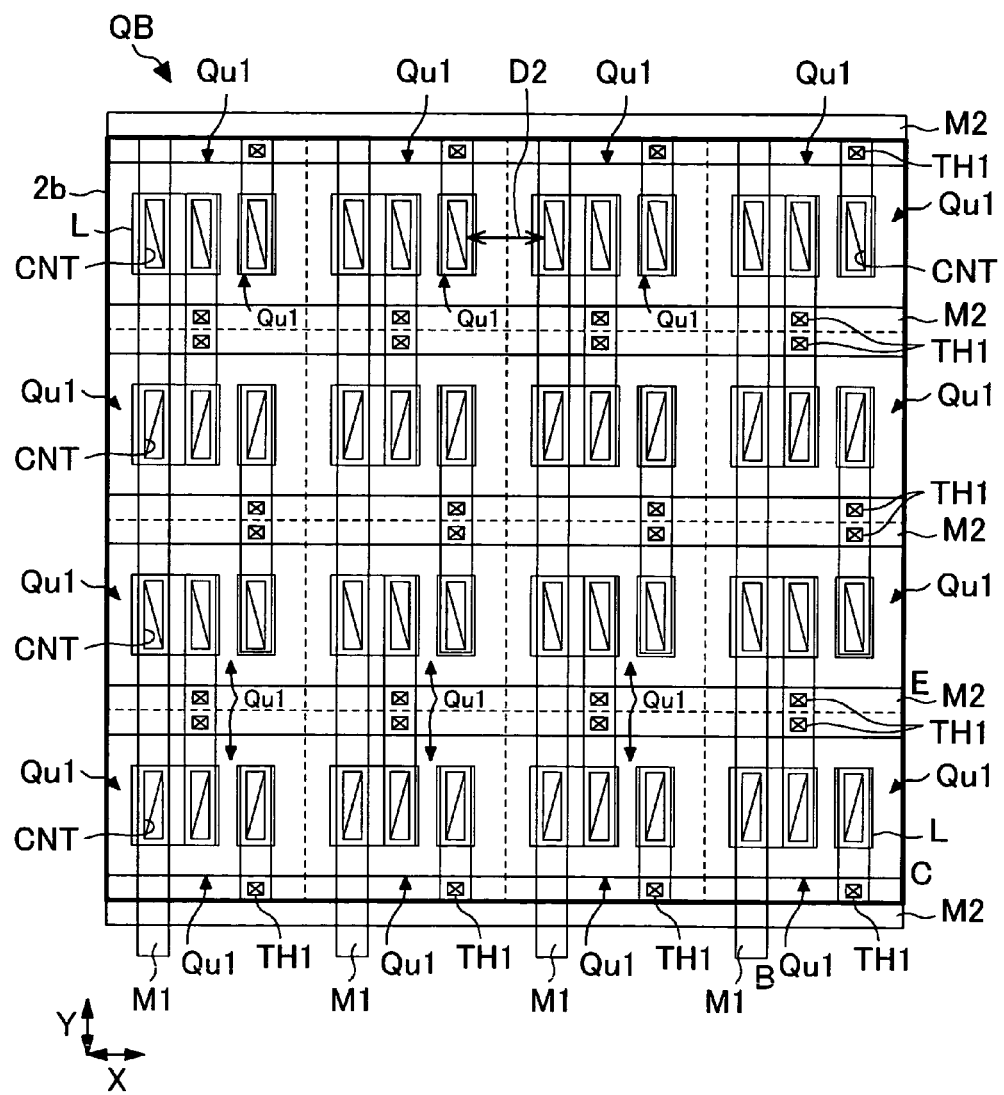
FIG. 7 is a top plan view of a key portion illustrating another example of a layout of the unit bipolar transistor shown in FIG. 2 and FIG. 3.
Figure 8:
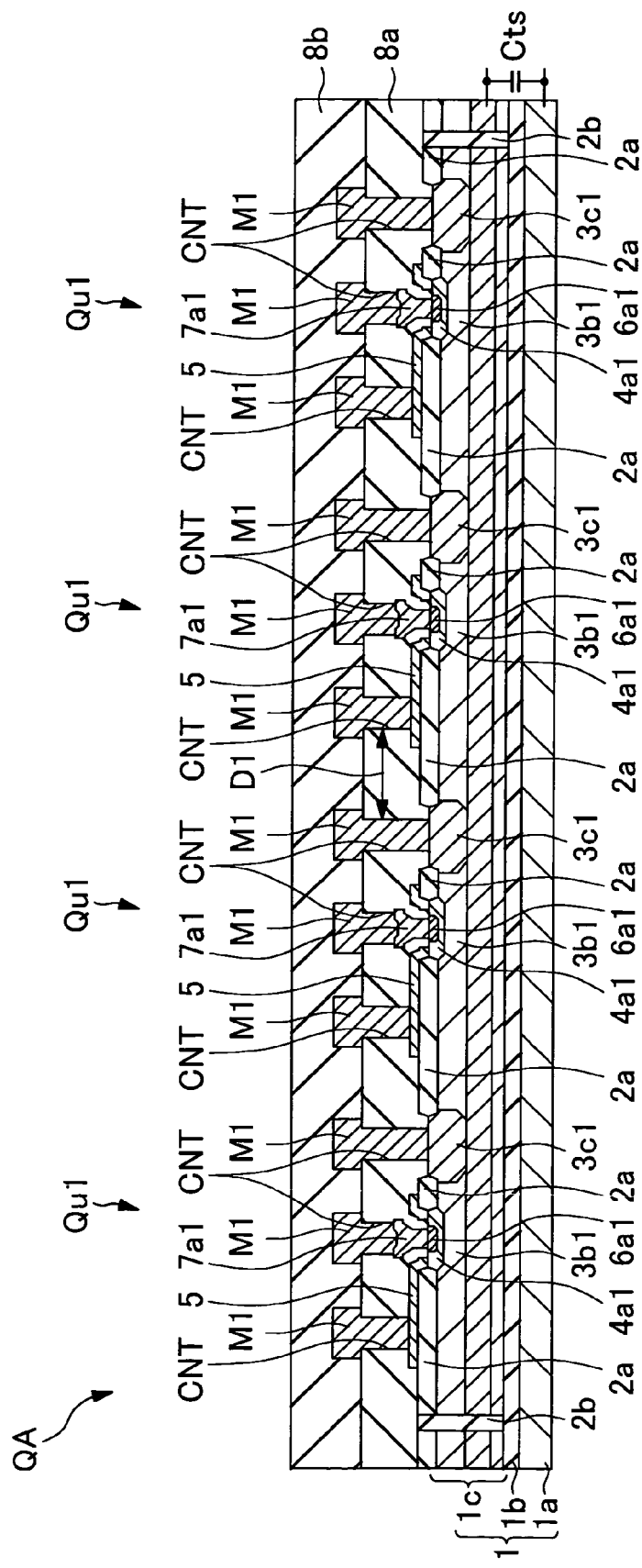
FIG. 8 is a cross-sectional view of the cell cut along a line X2-X2 in FIG. 6.

FIG. 6 is a top plan view of a key portion illustrating one example of a layout of the npn-type unit bipolar transistor Qu1. FIG. 7 is a top plan view of a key portion illustrating another example of a layout of the npn-type unit bipolar transistor Qu1. FIG. 8 is a cross-sectional view of the cell cut along a line X2-X2 in FIG. 6. FIG. 6 to FIG. 8 illustrate a formation of an npn-type transistor for a power system that is used in an output circuit or a power supply circuit by using a plurality of npn-type unit transistors Qu1, for the npn-type transistor QA shown in FIG. 1. The npn-type transistor for a power system refers to a transistor that flows inter emitter-collector current (IEC) of 1 mA or more, particularly about 2 mA or more, in the npn-type unit transistor Qu1 having the above sizes.

FIG. 6 and FIG. 7 illustrate examples that 16 npn-type unit transistors Qu1 are disposed in four rows and four columns in a state that the directions of current that flow between the collector and the emitter are the same. The direction of current between the collector and the emitter of each npn-type unit transistor Qu1, or the direction of the array of the base region, the emitter region, and the collector region of each npn-type unit transistor Qu1 follows the direction X shown in FIG. 6 and FIG. 7 respectively. The npn-type unit transistors Qu1 in the first and second rows are disposed symmetrically in up and down directions in a state that these npn-type unit transistors share the first layer wiring M1 for each emitter. The first layer wiring M1 for each emitter is electrically connected to the common second layer wiring M2 through the through hole TH1. The npn-type unit transistors Qu1 in the third and fourth rows also have an array similar to that of the npn-type unit transistors Qu1 in the first and second rows. The npn-type unit transistors Qu1 in the second and third rows are disposed symmetrically in up and down directions in a state that these npn-type unit transistors share the first layer wiring M1 for each collector. The first layer wiring M1 for each collector is electrically connected to the common second layer wiring M2 through the through hole TH1. A plurality of npn-type unit transistors Qu1 disposed in the Y direction share the first layer wiring M1 for each base. As explained above, the plurality of npn-type unit transistors Qu1 share the first layer wiring M1 and the second layer wiring M2 for the emitter, the collector, and the base respectively. With this arrangement, the total area of the npn-type transistor QA having the plurality of npn-type unit transistors Qu1 can be minimized. In FIG. 6 and FIG. 7, a distance D1 between adjacent unit transistors Qu1 and between the collector contact hole CNT and the base contact hole CNT for the Qu1 along the direction X is a minimum distance between adjacent transistors within the substrate 1. For example, this distance D1 is 2 μn. Preferably, the distance D1 is 1 μm or more. This is because when the distance D1 is smaller than 1 μm, the heat radiation characteristic is degraded according to the investigation carried out by the inventors.

In the layout shown in FIG. 6, out of the 16 npn-type unit transistors Qu1, eight npn-type unit transistors Qu1 in the first and second rows and eight npn-type unit transistors Qu1 in the third and fourth rows are surrounded with mutually separate deep trench isolations 2b. FIG. 6 illustrates the layout of the deep trench isolation 2b slightly inside the external periphery of the cell of the eight npn-type unit transistors Qu1. As shown in FIG. 8, the deep trench isolation 2b is formed to have an insulation film, such as a silicon oxide film, embedded within a deep trench that is formed from the upper surface of the shallow groove isolation 2a to reach the insulation layer 1b through the shallow groove isolation 2a and the semiconductor layer 1c. The plane surface width (i.e., a short side direction) of the deep trench isolation 2b is about 0.4 μm, for example, which is close to the minimum processing size. On the other hand, FIG. 7 illustrates a layout of the whole 16 npn-type unit transistors Qu1 that are surrounded with one deep trench isolation 2b. In FIG. 7, the deep trench isolation 2b is disposed on the external peripheral line of the 16 npn-type unit transistors Qu1. A cross-sectional diagram of the structure shown in FIG. 7 corresponding to the line X2-X2 in FIG. 6 is omitted, as the position of the deep trench isolation 2b is slightly at the outside, with the rest portions remain unchanged.

As explained above, when the deep trench isolation 2b surrounds one group or the whole of the plurality of npn-type unit transistors Qu1, it becomes possible to improve the heat radiation characteristic as compared with when the trench isolation 2b surrounds each one npn-type unit transistor Qu1. Further, a thermal coupling between the unit transistors Qu1 that are connected in parallel can be made satisfactory. Therefore, a difference between temperatures of the unit transistors Qu1 can be made smaller, and the uniformity of temperature can be improved. Accordingly, the thermal stability of the semiconductor device during the operation can be improved. As the unit transistors Qu1 surrounded with the deep trench isolation 2b are the same kind of unit transistor Qu1 that are connected in parallel, a parasitic effect such as latch up does not occur. Consequently, the reliability of the operation of the semiconductor device can be improved. When FIG. 6 is compared with FIG. 7, the region surrounded with the deep trench isolation 2b in FIG. 7 is larger than that shown in FIG. 6. Therefore, the thermal stability (i.e., the heat radiation characteristic and the temperature uniformity between the unit transistors Qu1) of the configuration shown in FIG. 7 can be improved more than that shown in FIG. 6. On the other hand, the region surrounded with the deep trench isolation 2b in FIG. 6 is larger than that shown in FIG. 7. Therefore, a parasitic capacitance (i.e., capacitance formed by the semiconductor layer 1c surrounded with the deep trench isolation 2b, the supporting substrate 1a, and the insulation layer 1b between them) Cts of the configuration in FIG. 6 can be made smaller than that in the configuration shown in FIG. 7. As a result, the operation speed of the npn-type transistor QA can be improved.

Second Embodiment

In the second embodiment, one example of an addition of a ballast resistor to the emitter of the unit transistor will be explained.

Figure 9:
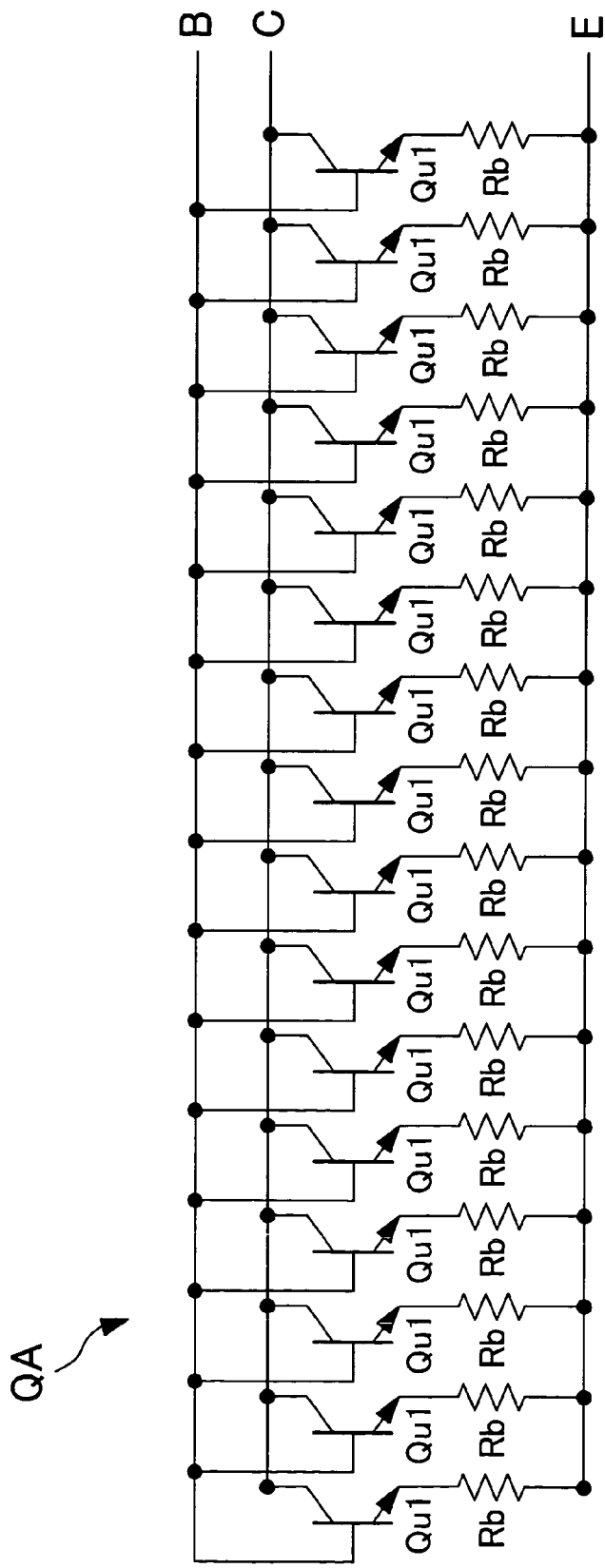
FIG. 9 is an equivalent circuit diagram of a desired bipolar transistor that constitutes a semiconductor device according another embodiment of the present invention.

FIG. 9 is an equivalent circuit diagram of a desired npn-type transistor QA according to the second embodiment of the present invention. In the second embodiment, the desired npn-type transistor QA is also formed based on a parallel connection of a plurality of the same kind of npn-type unit transistors Qu1. The configuration of the second embodiment is different from that of the first embodiment in that a resistor Rb (which is usually called a ballast resistor) is electrically connected to the emitter of each unit transistor Qu1.

When a resistor Rb is not connected, a rise in the temperature of any one of the plurality of unit transistors Qu1 causes a concentration of a current flow to this unit transistor Qu1. This has a risk of bringing about an overheating. On the other hand, when the resistor Rb is added, a negative feedback is applied to the increase in the emitter current, which can work to decrease the emitter current quantity. Accordingly, it is possible to completely prevent the occurrence of a current concentration (i.e., overheating) attributable to the unevenness of the temperature generated between the unit transistors Qu1. Consequently, the thermal stability of the semiconductor device during the operation can be further improved, and the operation reliability can be improved. In order to obtain this effect, the resistance of each resistor Rb is equal. When the resistance is larger, the stability of the unit transistor Qu1 against heat can be improved. However, this lowers power characteristic. Therefore, it is preferable that the resistance is as small as possible while taking the thermal stability into consideration.

Figure 10:
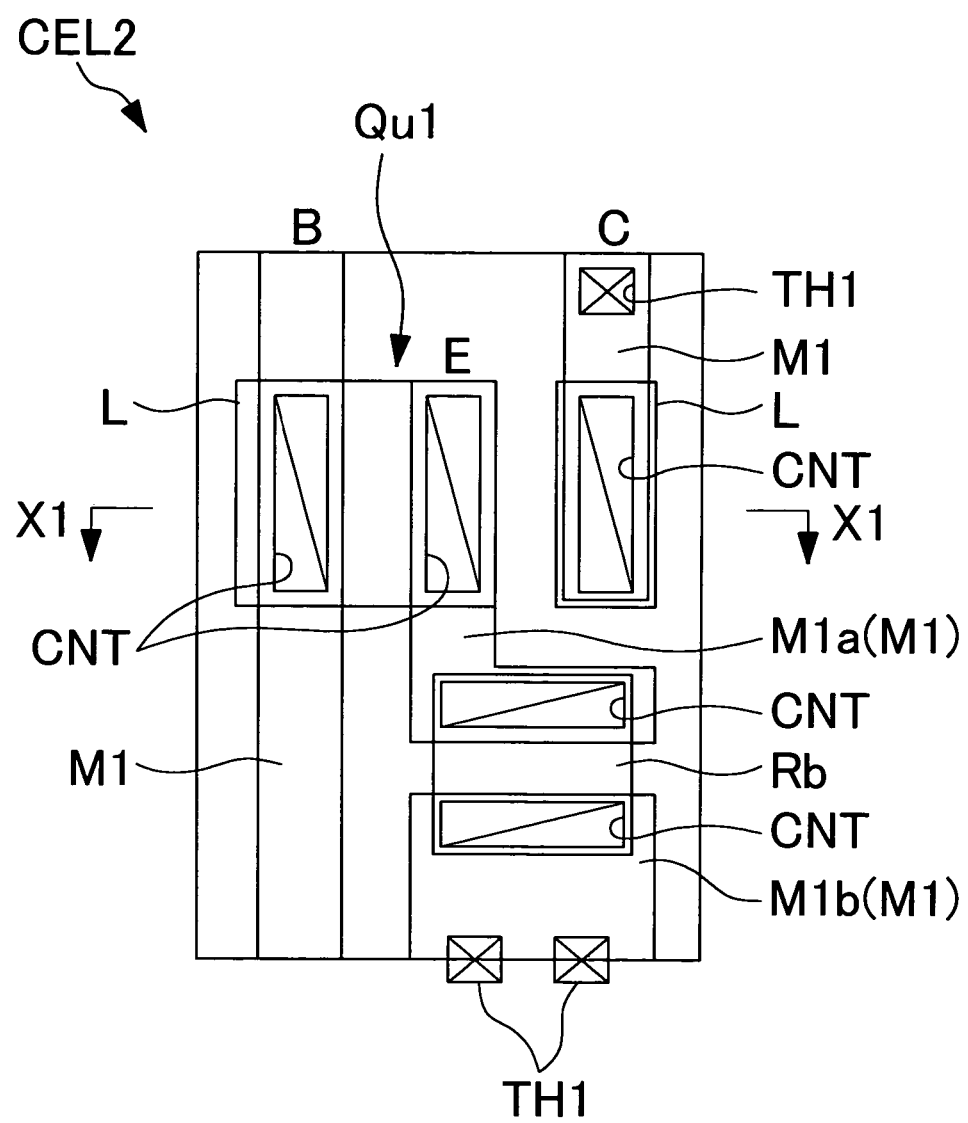
FIG. 10 is a top plan view illustrating one example of a cell of the bipolar transistor shown in FIG. 9.
Figure 11:
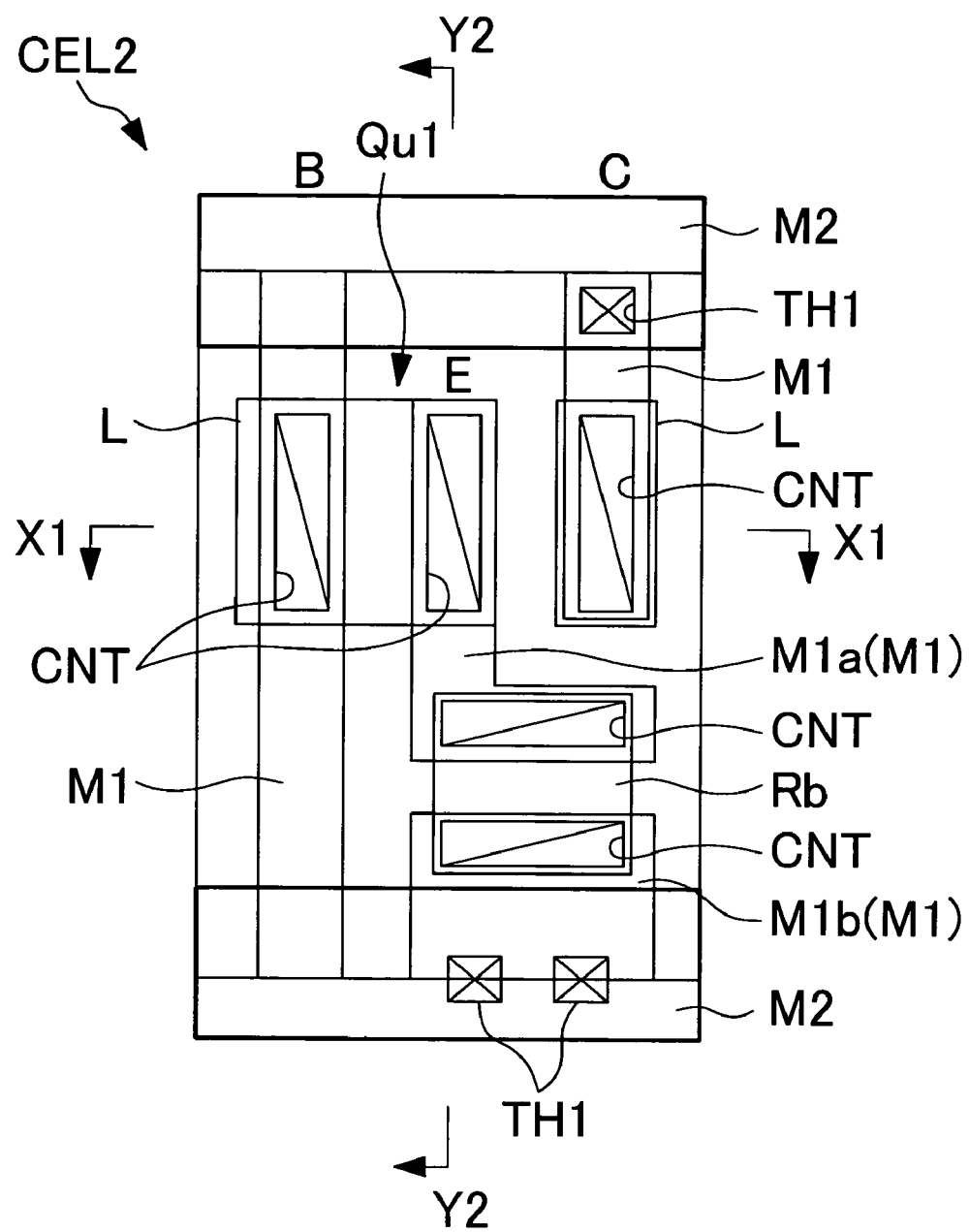
FIG. 11 is a top plan view illustrating one example of the cell of the unit bipolar transistor shown in FIG. 9, having a second layer wiring disposed in the configuration shown in FIG. 10.
Figure 12:
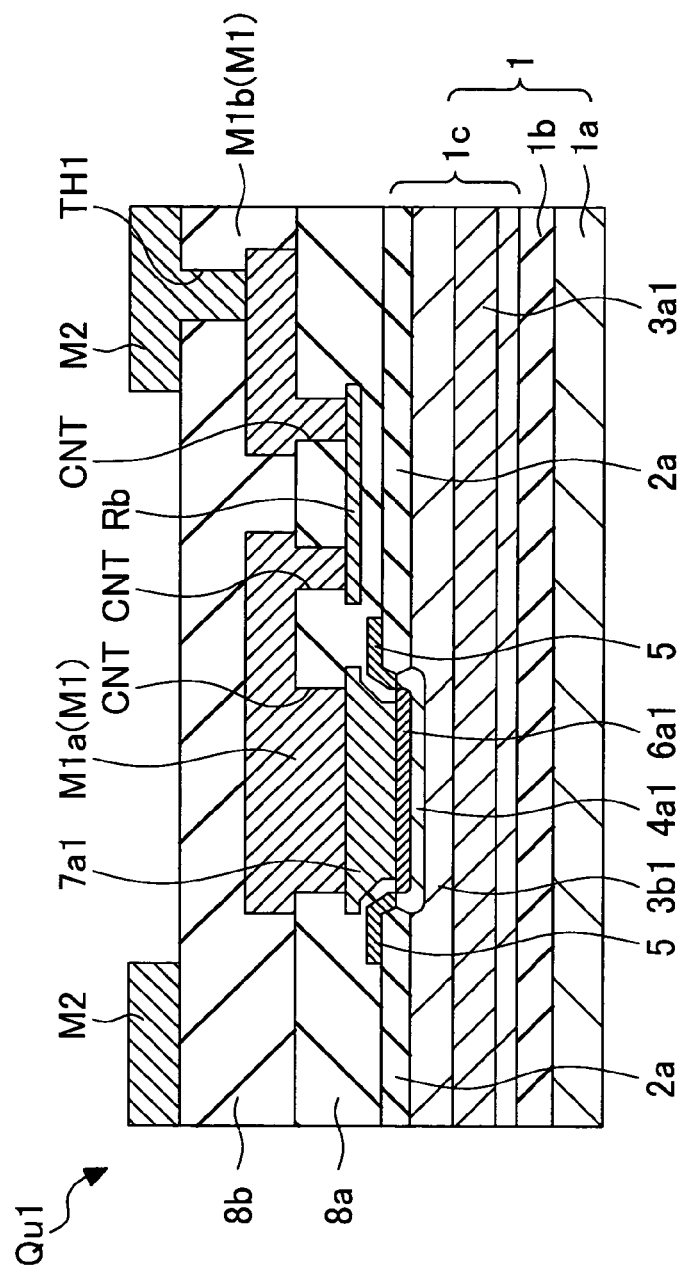
FIG. 12 is a cross-sectional view of the cell cut along a line Y2-Y2 in FIG. 11.

FIG. 10 is a top plan view illustrating one example of a cell CEL2 of the npn-type unit transistor QU1 according to the present embodiment. FIG. 11 is a top plan view illustrating the cell that has a second layer wiring M2 disposed in the configuration shown in FIG. 10. FIG. 12 is a cross-sectional view of the cell cut along a line Y2-Y2 in FIG. 11. A cross-sectional diagram of the configurations shown in FIG. 10 and FIG. 11 cut along the line X1-X1 respectively is the same as that shown in FIG. 4.

A first layer wiring M1a (M1) that is connected to the emitter region of the npn-type unit transistor Qu1 is connected to one end of the resistor Rb through the contact hole CNT. The other end of the resistor Rb is connected to a first layer wiring M1b ((M1) via the contact hole CNT. The first layer wiring M1b is connected to the second layer wiring M2 via the through hole TH1. The resistor Rb comprises of polycrystalline silicon that is set to a desired resistance. The resistor comprised of polycrystalline silicon can be formed as an exclusive layer, or can be patterned at the same time as patterning the emitter drawing electrode 7a1. The resistance of the resistor Rb is set according to an introduction (i.e., ion injection) of a desired impurity into a polycrystalline silicon film. The resistor Rb can be formed as a diffusion layer. However, when the resistor Rb is formed using polycrystalline silicon, the degree of freedom of disposing the resistor Rb and the deep trench isolation 2b can be improved more than when the resistor Rb is formed as the diffusion layer.

Figure 13:
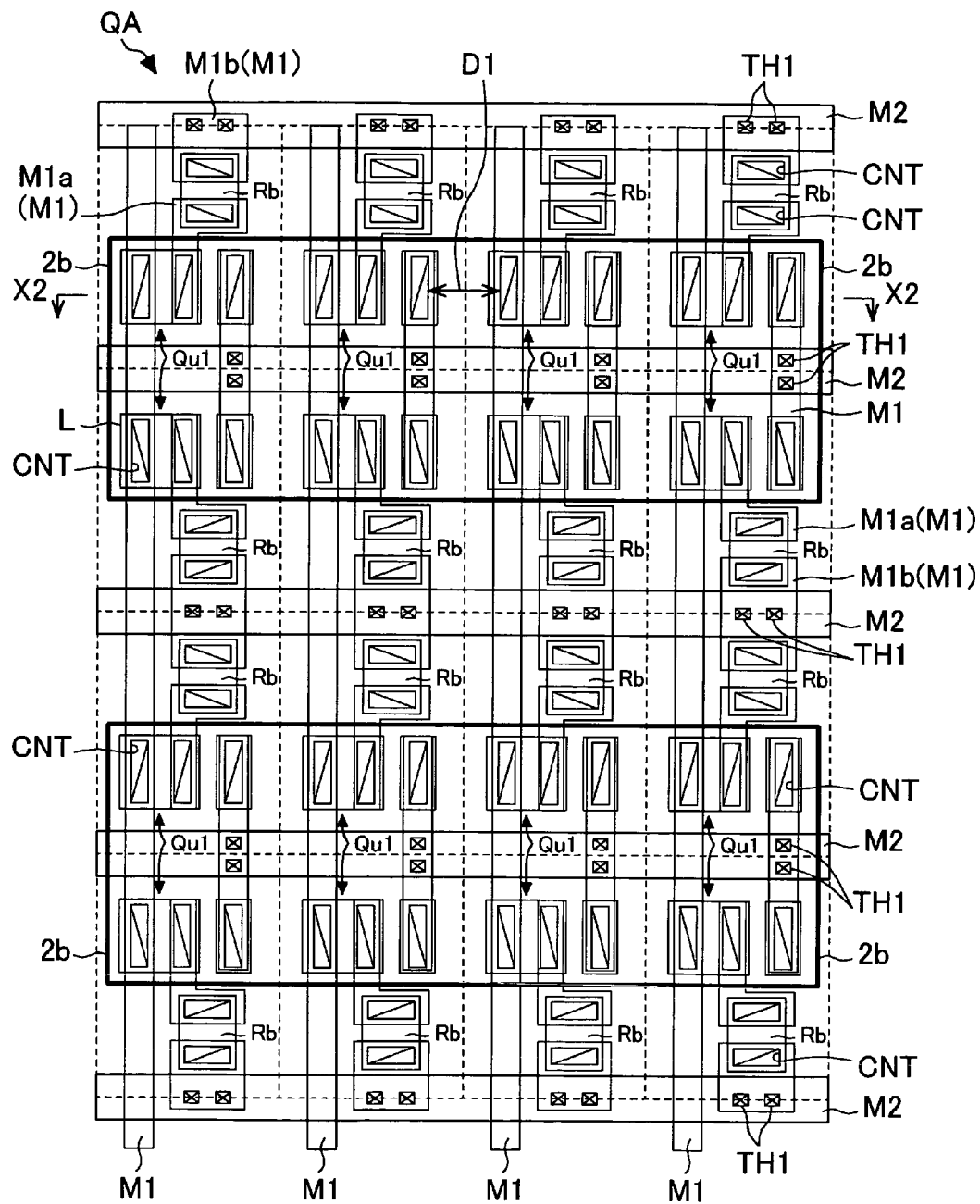
FIG. 13 is a top plan view of a key portion illustrating one example of a layout of the unit bipolar transistor shown in FIG. 10 and FIG. 11.
Figure 14:
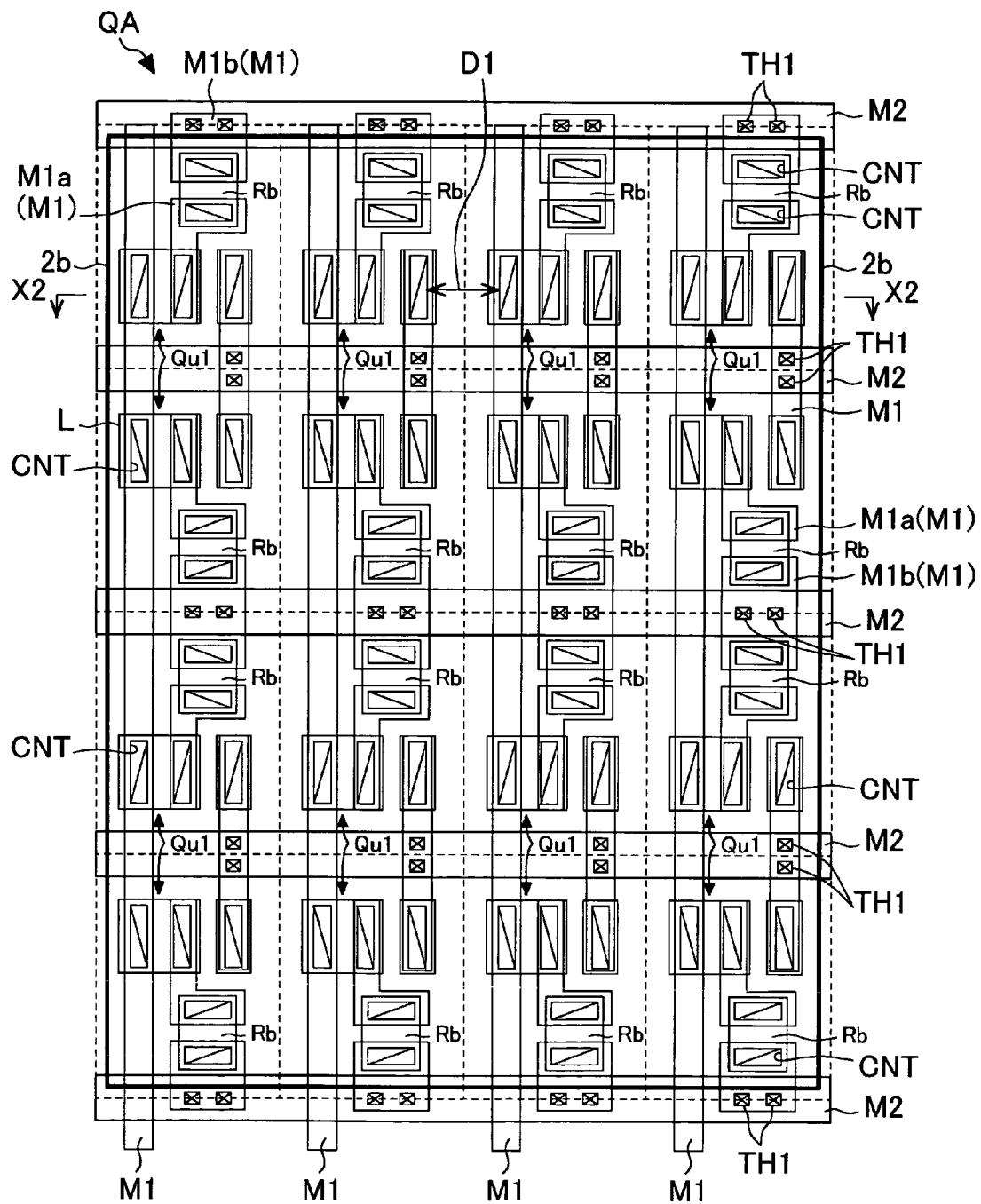
FIG. 14 is a top plan view of a key portion illustrating another example of a layout of the unit bipolar transistor shown in FIG. 10 and FIG. 11.

FIG. 13 is a top plan view of a key portion illustrating one example of a layout of the npn-type unit transistor Qu1 according to the second embodiment. FIG. 14 is a top plan view of a key portion illustrating another example of a layout of the npn-type unit transistor Qu1 according to the second embodiment. FIG. 13 and FIG. 14 each illustrates a formation of the npn-type transistor for the power system using a plurality of npn-type unit transistors Qu1 according to the second embodiment, as the npn-type transistor QA shown in FIG. 1.

The dispositions of the unit transistors Qu1 in FIG. 13 and FIG. 14 are basically the same as those explained for the first embodiment with reference to FIG. 6 and FIG. 7 respectively, except that the resistor Rb is added to each unit transistor Qu1. The unit transistors Qu1 in the first and second rows are disposed symmetrically in up and down directions in a state that these unit transistors share the first layer wiring M1 for each collector. The first layer wiring M1 for each collector is electrically connected to the common second layer wiring M2 through the through hole TH1. The unit transistors Qu1 in the third and fourth rows also have an array similar to that of the unit transistors Qu1 in the first and second rows. The unit transistors Qu1 in the second and third rows are disposed symmetrically in up and down directions in a state that these unit transistors share the first layer wiring M1b (M1) for each emitter. The first layer wiring M1b (M1) for each emitter is electrically connected to the common second layer wiring M2 through the through hole TH1. A plurality of unit transistors Qu1 disposed in the Y direction share the first layer wiring M1 for each base, in a similar manner to that shown in FIG. 6 and FIG. 7. With this arrangement, the total area of the npn-type transistor QA having the plurality of unit transistors Qu1 and the resistors Rb can be minimized, like in the first embodiment.

In the layout shown in FIG. 13, out of the 16 unit transistors Qu1, eight unit transistors Qu1 in the first and second rows and eight unit transistors Qu1 in the third and fourth rows are surrounded with mutually separate deep trench isolations 2b. FIG. 13 illustrates the layout of the deep trench isolation 2b slightly inside the external periphery of the cell of the eight unit transistors Qu1. The resistors Rb are not included within the region surrounded with the deep trench isolation 2b. A cross-sectional diagram of the configuration in FIG. 13 cut along the line X2-X2 is the same as that shown in FIG. 8. On the other hand, FIG. 14 illustrates a layout of the whole 16 unit transistors Qu1 that are surrounded with one deep trench isolation 2b. In FIG. 14, the deep trench isolation 2b is disposed on the external peripheral line of the 16 unit transistors Qu1. The resistors Rb are included within the region surrounded with the deep trench isolation 2b. A cross-sectional diagram of the configuration in FIG. 14 cut along the line X2-X2 corresponding to the same line in FIG. 13 is similar to that shown in FIG. 8, except that the position of the deep trench isolation 2b is slightly at the outside. Therefore, this cross-sectional diagram is omitted.

As explained above, according to the second embodiment, when the deep trench isolation 2b surrounds the plurality of unit transistors Qu1, it becomes possible to obtain the effect similar to that of the first embodiment. From the configuration shown in FIG. 13, the effect similar to that of the configuration shown in FIG. 6 can be obtained. From the configuration shown in FIG. 14, the effect similar to that of the configuration shown in FIG. 7 can be obtained.

Third Embodiment

In the third embodiment, a semiconductor device having a desired transistor configured using a plurality of the same kind of unit transistors connected in parallel will be explained. This semiconductor device has both a structure in which a deep trench isolation surrounds one group of the plurality of unit transistors, and a structure in which a deep trench isolation surrounds each of the unit transistors.

The structure in which one deep trench isolation surrounds the plurality of unit transistors connected in parallel has the effect of obtaining thermal stability as explained in the first and second embodiments. This structure is suitable for a large-current circuit and a high heat-generation circuit. On the other hand, the structure in which a deep trench isolation surrounds each of the unit transistors can minimize the parasitic capacitance Cts, and therefore, has the effect of improving the operation speed. This structure is suitable for a high-performance circuit. Therefore, according to the third embodiment, in one semiconductor device, a high-driving circuit (i.e., a circuit that requires the heat radiation characteristic) has a structure in which a deep trench isolation collectively surrounds the plurality of unit transistors as explained in the first and second embodiments. A high-performance circuit (i.e., a circuit that requires high performance) has a structure in which a deep trench isolation individually surrounds each of the unit transistors. With this arrangement, the operation reliability and performance of the semiconductor device can be improved.

Figure 15:
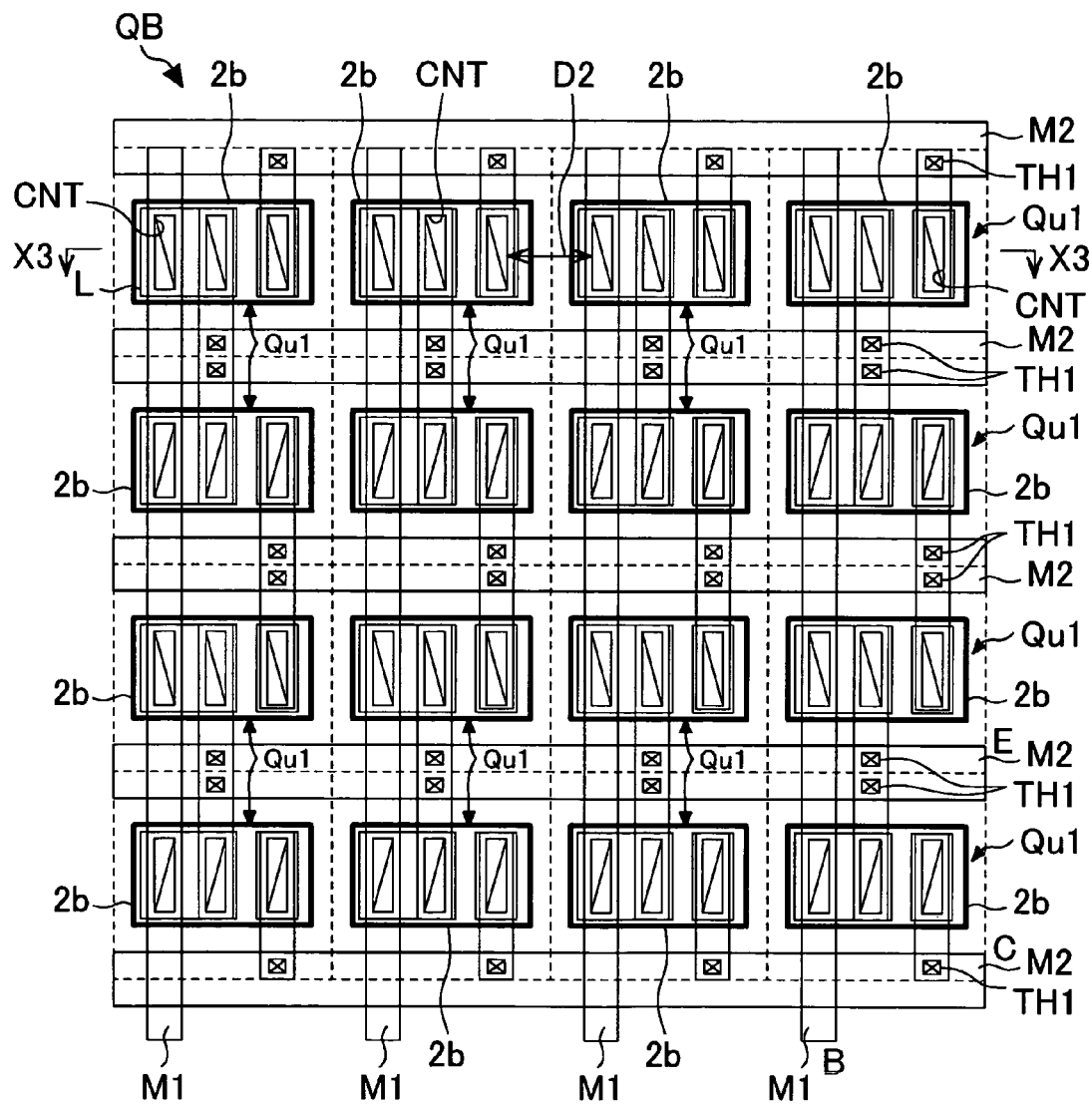
FIG. 15 is a top plan view of a key portion illustrating one example of a layout of a unit bipolar transistor of the semiconductor device according to still another embodiment of the present invention.
Figure 16:
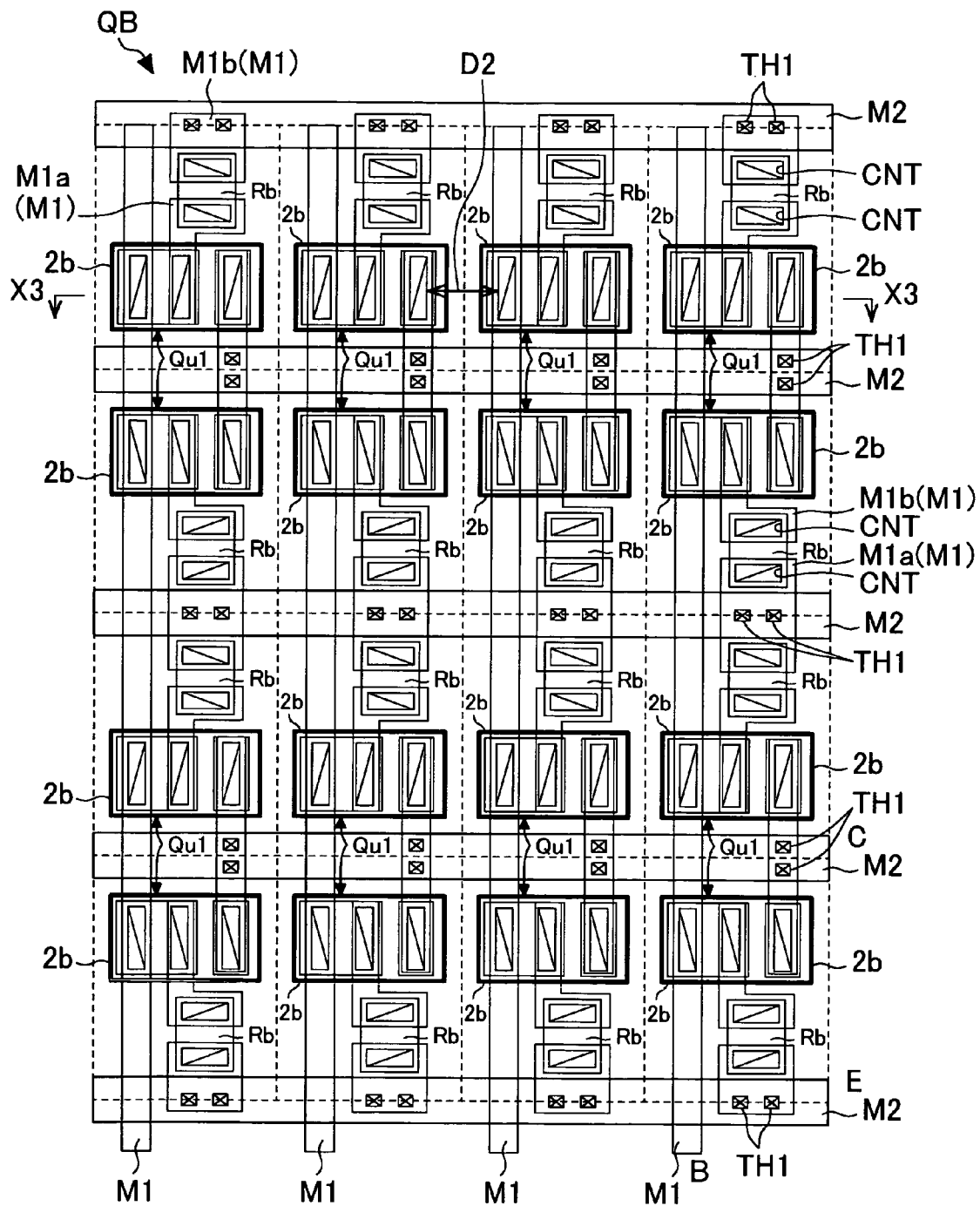
FIG. 16 is a top plan view of a key portion illustrating another example of the layout of the unit bipolar transistor of the semiconductor device according to still another embodiment of the present invention.
Figure 17:
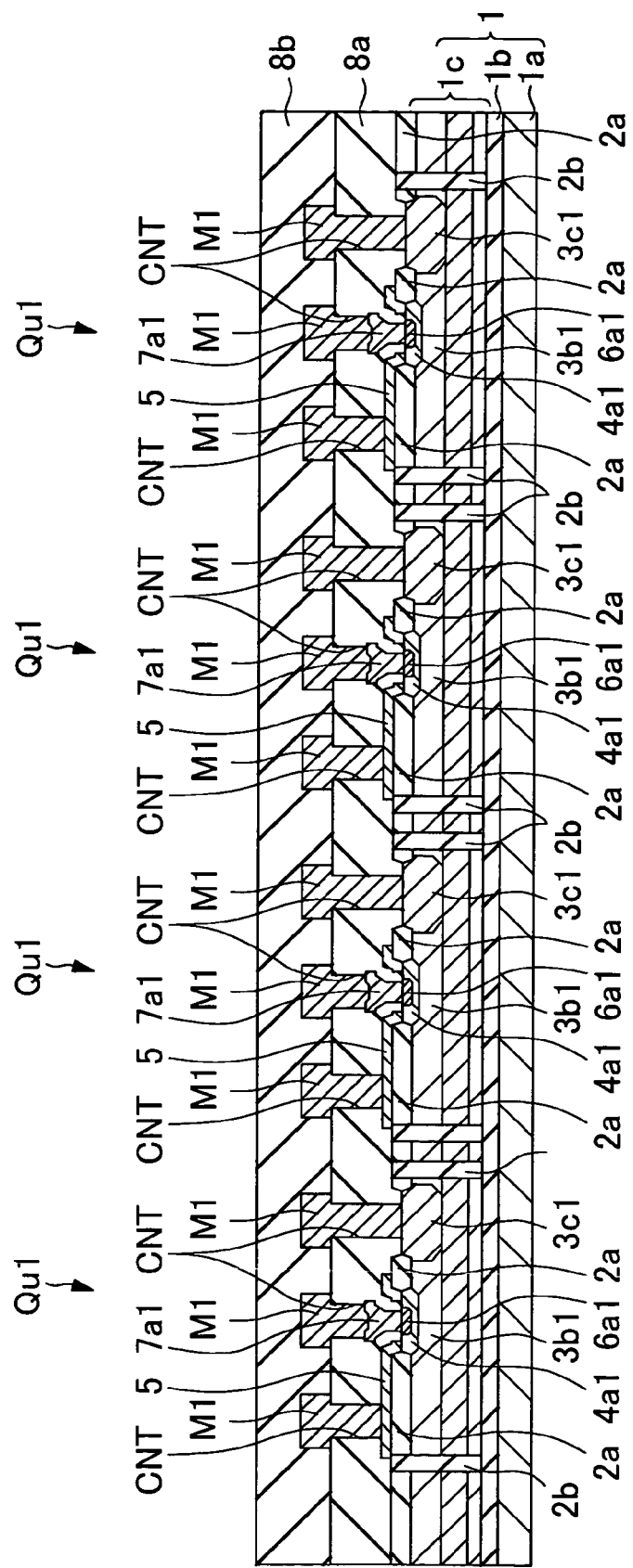
FIG. 17 is a cross-sectional view of the unit bipolar transistor cut along a line X3-X3 in FIG. 15 and FIG. 16.

FIG. 15 is a top plan view of a key portion illustrating one example of a layout of a plurality of npn-type unit transistors Qu1 that constitute an npn-type transistor QB that forms the high-performance circuit. FIG. 16 is a top plan view of a key portion illustrating another example of a layout of a plurality of npn-type unit transistors Qu1 that constitute an npn-type transistor QB that forms the high-performance circuit. FIG. 17 is a cross-sectional view of the npn-type transistor QB cut along a line X3-X3 in FIG. 15 and FIG. 16.

An equivalent circuit diagram of the transistor QB shown in FIG. 15 is the same as that of the transistor QA shown in FIG. 1. The unit transistors Qu1 in FIG. 15 are disposed in the same manner as that shown in FIG. 6. On the other hand, FIG. 16 illustrates a configuration having the emitter resistors Rb added to the unit transistors Qu1. An equivalent circuit diagram of the transistor QB shown in FIG. 16 is the same as that shown in FIG. 9. The unit transistors Qu1 in FIG. 16 are disposed in the same manner as that shown in FIG. 14. FIG. 15 and FIG. 16 are different from FIG. 6 and FIG. 14 in that the deep trench isolation 2b surrounds each of the plurality of unit transistors Qu1 that are connected in parallel. Based on this structure, as the semiconductor layer 1c is partitioned into small sections by the deep trench isolations 2b, the parasitic capacitance Cts can be minimized. Accordingly, the operation speed of the semiconductor device can be improved. Therefore, it is preferable that this structure is applied to a circuit that requires high performance such as a logic circuit and a control circuit, for example.

In FIG. 15 and FIG. 16, a distance D2 between adjacent unit transistors Qu1 and between the collector contact hole CNT and the base contact hole CNT for the Qu1 along the direction X is equal to the distance D1 explained in FIGS. 6 to 8, FIG. 13 and FIG. 14. In other words, according to the configurations shown in FIGS. 6 to 8, FIG. 13 and FIG. 14, the deep trench isolation 2b surrounds the plurality of unit transistors Qu1. Therefore, the distance between the unit transistors Qu1 (for example, the distance D1) can be made smaller than the distance between the unit transistors Qu1 (for example, the distance D2) where the deep trench isolation 2b surrounds each of the plurality of unit transistors Qu1. However, in the third embodiment, by taking into consideration the fact that the circuit that uses the configurations shown in FIGS. 6 to 8, FIG. 13 and FIG. 14 requires the heat radiation characteristic, the distance D2 is dared to be set equal to the distance D1. Further, in the third embodiment, a permissible maximum current value (Icmax1) of the unit transistor Qu1 having the configurations shown in FIGS. 6 to 8, FIG. 13 and FIG. 14 that requires the heat radiation characteristic is larger than a permissible maximum current value (Icmax2) of the unit transistor Qu1 having the configurations shown in FIG. 15 to FIG. 17 that require the high-performance characteristic. More specifically, Icmax1>Icmax2 times 1.5.

Figure 18:
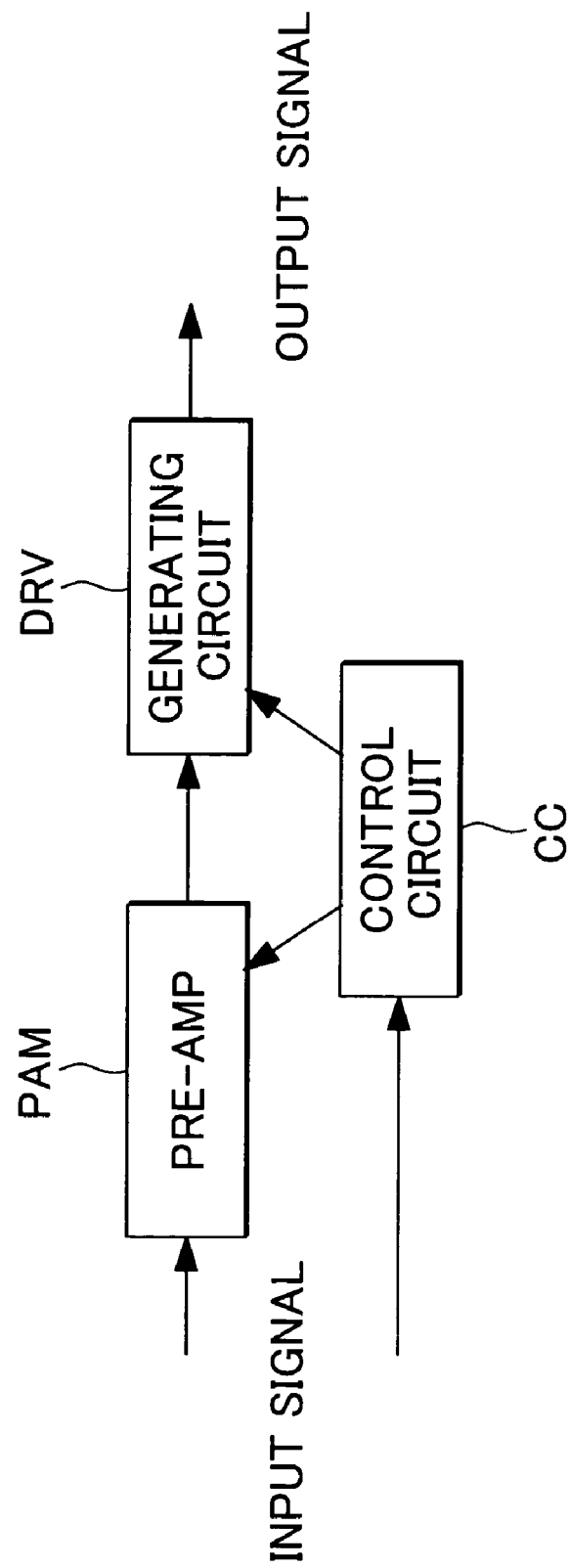
FIG. 18 is an explanatory diagram of a key portion of a detailed circuit of a semiconductor device according to still another embodiment of the present invention.

FIG. 18 is an explanatory diagram of a key portion of a semiconductor device having an analog-digital hybrid circuit.

FIG. 18 illustrates an example that an output circuit DRV is disposed at the latter stage of a preamplifier PAM and a control circuit CC. As explained in FIG. 15 to FIG. 17, in the transistor that constitutes the preamplifier circuit PAM and the control circuit CC, the deep trench isolation 2b surrounds each of the plurality of unit transistors that are connected in parallel. With this arrangement, the operation speed of the preamplifier circuit PAM and the control circuit CC can be improved. On the other hand, in the transistor that constitutes the output circuit DRV, the deep trench isolation 2b surrounds the plurality of unit transistors that are connected in parallel, as explained with reference to FIGS. 6 to 8, FIG. 13 and FIG. 14. With this arrangement, the thermal stability of the output circuit DRV can be improved, and the operation reliability can be improved. Therefore, the total operation reliability and the performance of the semiconductor device having the analog-digital hybrid circuit can be improved.

Figure 19:
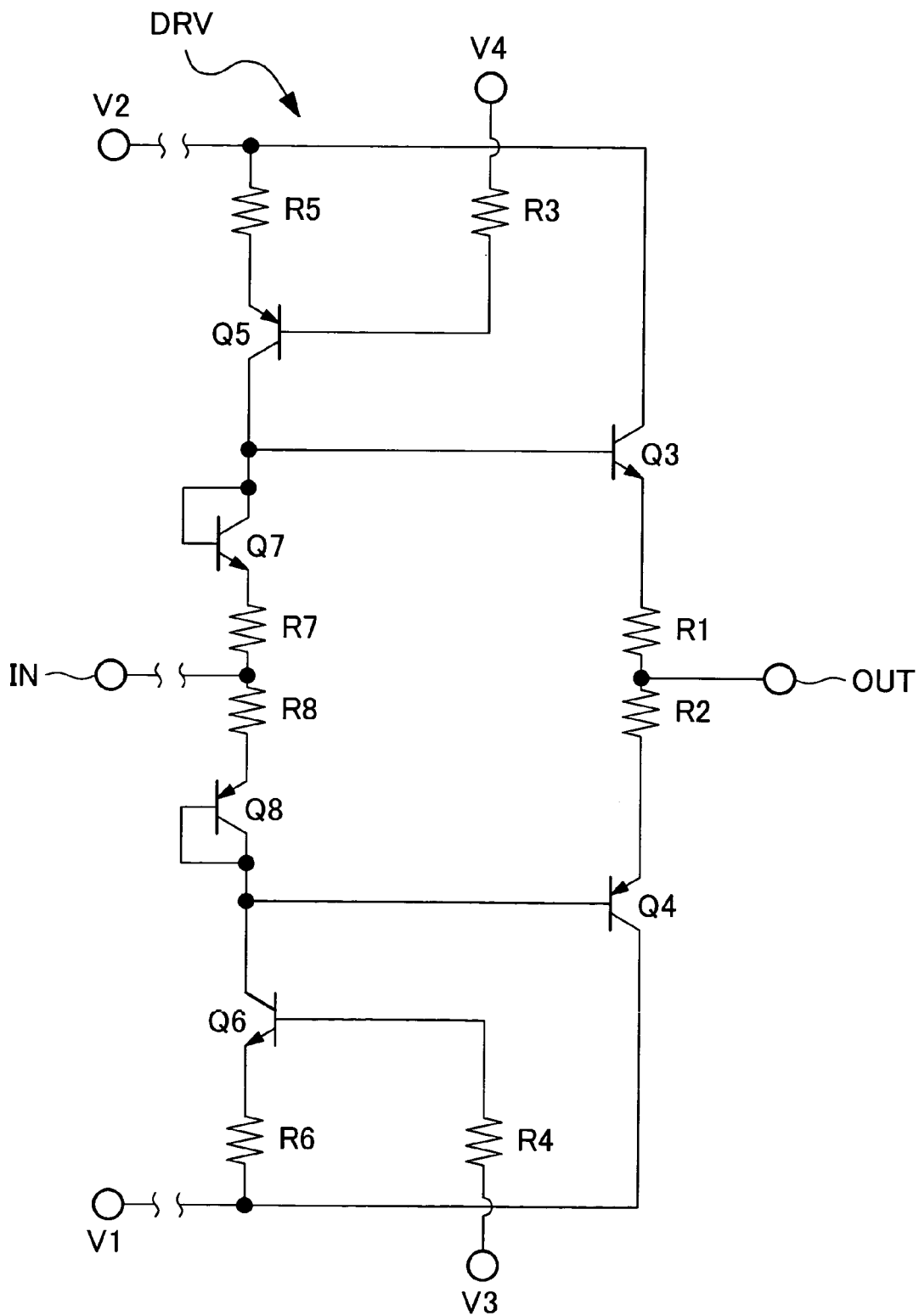
FIG. 19 is a circuit diagram illustrating one example of an output circuit of the semiconductor device shown in FIG. 18.

FIG. 19 is a circuit diagram illustrating one example of the output circuit DRV. In this example, a driver circuit that carries out a B-class push pull amplification operation is used for the output circuit. When the B-class push pull operation is carried out, this driver circuit can obtain an output that is four times the output obtained when one transistor is used to form the driver circuit. It becomes possible to carry out the amplification with small noise and distortion. In this case, the output circuit DRV can amplify a signal of about 1 mA that is input to an input terminal IN into a signal having an amplitude of abut 10 mA and output this signal to an output terminal OUT. This output circuit DRV has transistors Q3 to Q8 and resistors R1 to R8, and is electrically connected to between a power supply V1 of a reference potential and a power supply V2 of a high potential. A voltage of the power supply V1 is about −5 voltages, and a voltage of the power supply V2 is about +5 voltages. A voltage of a power supply V3 for bias adjustment is about −1 voltage, and a voltage of a power supply V4 is about +1 voltage.

Transistors Q3, Q6, and Q7 of the output circuit DRV comprise npn-type transistors. Transistors Q4, Q5, and Q8 of the output circuit DRV comprise pnp-type transistors. Among these transistors, the transistors Q3 and Q4 are the pair of transistors that carry out the push pull operation. The transistors Q7 and Q8 are diode connected. A collector current (i.e., a required current capacitance or a required characteristic) that is necessary for the transistors Q3 and Q4 is about 24 mA, for example. A collector current that is necessary for the transistors Q5 to Q8 is about 8 mA, for example. These transistors Q3 to Q8 have configurations as shown in FIG. 6, FIG. 7, FIG. 13, and FIG. 14.

Figure 20:
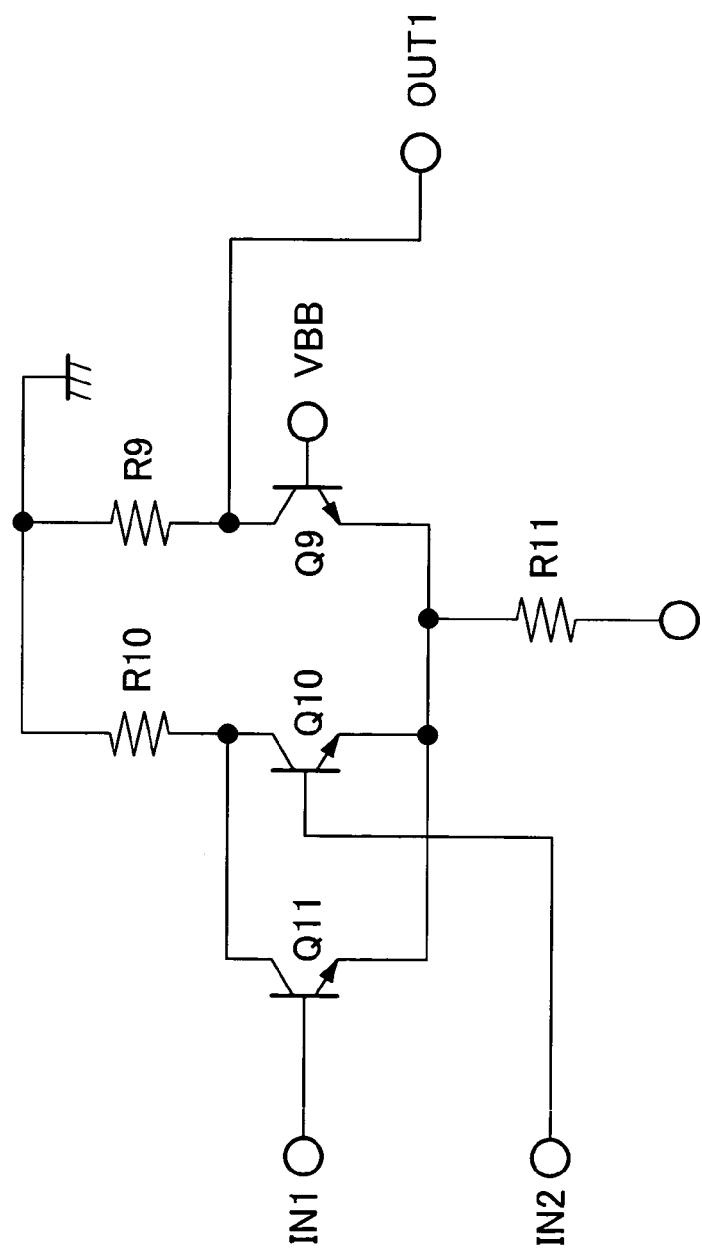
FIG. 20 is a circuit diagram illustrating one example of a digital circuit formed on the same semiconductor substrate on which the output circuit shown in FIG. 18 is formed.

FIG. 20 is a circuit diagram illustrating one example of a digital circuit formed on the same semiconductor substrate 1 on which the transistor that constitutes the output circuit DRV is formed. FIG. 20 illustrates an OR circuit that is formed based on an ECL (emitter coupled logic), for example. This OR circuit has transistors Q9 to Q11 and resistors R9 to R11. The transistors Q9 to Q11 are formed using npn-type transistors. As the digital circuit requires high-speed operation of the transistors Q9 to Q11, the transistors Q9 to Q11 have the configurations as shown in FIG. 15 to FIG. 17. As explained above, according to the third embodiment, the transistors having the configurations shown in FIG. 6 to FIG. 8, FIG. 13 and FIG. 14 and the transistors having the configuration shown in FIG. 15 to FIG. 17 are present on the same substrate. In other words, when transistor configurations are selected corresponding to the performance required for the transistors, a semiconductor device having high performance and high operation stability in total can be provided. The emitters of the transistors Q9 to Q11 shown in FIG. 20 are connected in common, and the transistor Q10 or the transistor Q11 constitutes a differential amplifier together with the transistor Q9. A reference symbol VBB denotes a DC reference voltage to fix a base potential of the transistor Q9 to a fixed level. For signals input to input terminals IN1 and IN2, an output signal from an output terminal OUT1 is for an OR operation. The digital circuit is not limited to the OR circuit, and various other circuits can be used. For example, logical gate circuits such as an NOR circuit, a NAND circuit, and an AND circuit can be used.

Figure 21:
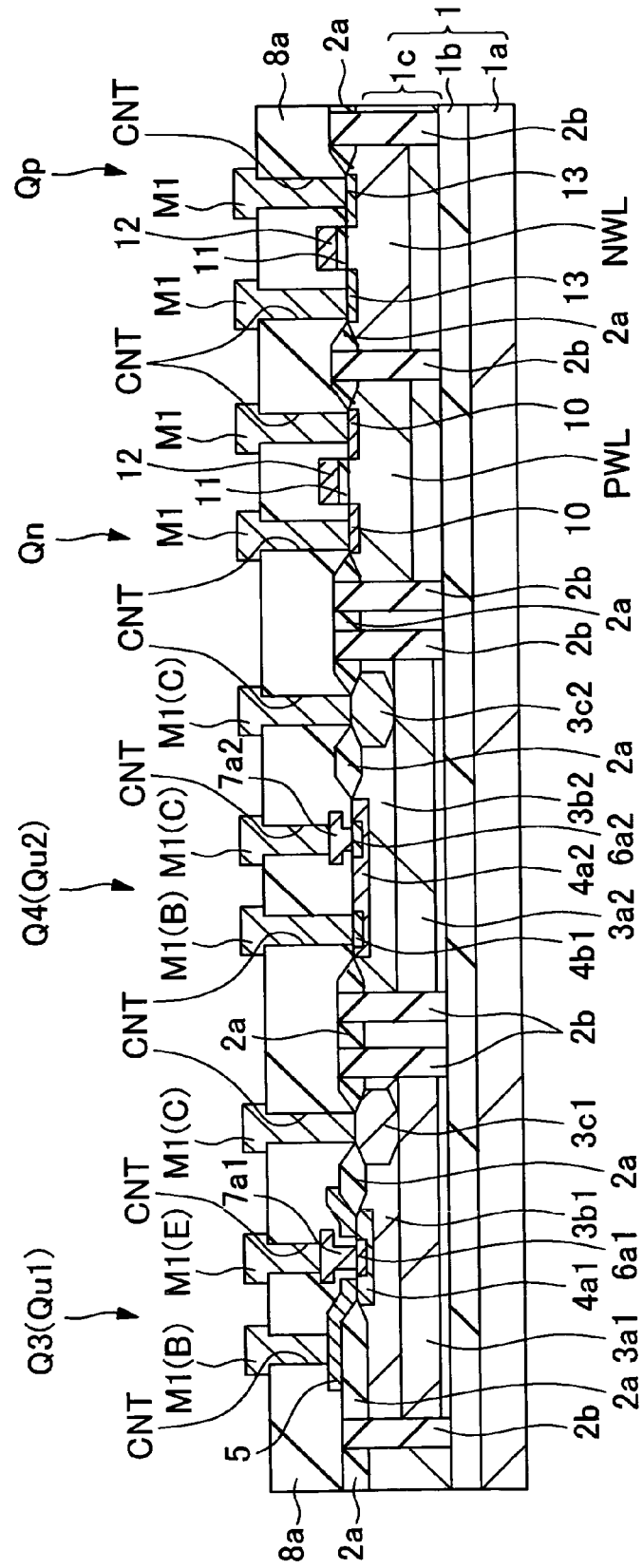
FIG. 21 is a cross-sectional view of a key portion illustrating one example of a semiconductor device having an analog-digital hybrid circuit according to still another embodiment of the present invention.

FIG. 21 is a cross-sectional view of a semiconductor device having an analog-digital hybrid circuit.

This semiconductor device has an analog-digital hybrid circuit for communication or industry having a BICMOS (Bipolar-Complementary Metal Oxide Semiconductor) circuit or a C-Bip (Complementary Bipolar) circuit. A part of the analog circuit (for example, a part of the output circuit) comprises a pair of the transistors Q3 and Q4. FIG. 21 illustrates a state that the deep trench isolation 2b surrounds only one npn-type unit transistor Qu1 and one pnp-type unit transistor Qu2 of the transistors Q3 and Q4. Actually, the deep trench isolation Qu1 surrounds the plurality of npn-type unit transistors Qu1 and the plurality of pnp-type unit transistors Qu2, as shown in FIG. 6 to FIG. 8, FIG. 13 and FIG. 14. The active region L and the area surrounded with the deep trench isolation 2b of each of the plurality of unit transistors Qu1 of the transistor Q3 are substantially the same as the active region L and the area surrounded with the deep trench isolation 2b of each of the plurality of unit transistors Qu2 of the transistor Q4 that forms a pair with the transistor Q3, on the same substrate 1. With this arrangement, the heat value of the operation current of the transistor Q3 and that of the transistor Q4 can be set substantially the same. The rising temperature in the active regions L of the transistor Q3 can be set substantially the same as that of the transistor Q4. Therefore, the symmetry of the electrical properties of the transistors Q3 and Q4 can be set substantially the same. In other words, the pair characteristics of the transistors Q3 and Q4 can be secured. Accordingly, the characteristics of the circuit formed by the pair of transistors Q3 and Q4 can be stabilized. Consequently, the operation stability of the analog circuit can be improved. As the pair characteristics can be secured easily and a large operation margin can be taken, the analog circuit that requires a high-level characteristic tuning can be designed easily. This configuration is preferable for application to a circuit that requires the pair characteristics like the output stage of the driver circuit, for example.

Unlike the npn-type unit transistor Qu1, the pnp-type unit transistor Qu2 has a one-layer polycrystalline silicon planar structure that can be processed easily. An embedded collector region 3a2 is formed in the semiconductor layer 1c (i.e., the semiconductor region). The embedded collector region 3a2 contains boron (B) for example, and is formed in the p$^+$ type. A collector region 3b2 and a collector drawing region 3c2 are formed in the upper layer of the embedded collector region 3a2. The collector region 3b2 and the collector drawing region 3c2 contain boron, for example, and are formed in the p type and the p$^+$ type respectively. The shallow groove isolation 2a is provided between the collector region 3b2 and the collector drawing region 3c2. The collector region 3b2 and the collector drawing region 3c2 are electrically connected to each other in a low resistance respectively through the embedded collector region 3a2.

A base region 4a2 is formed in the upper layer of the collector region 3b2. The base region 4a2 contains arsenic or boron, for example, and is formed in the n type. A base drawing region 4b1 is formed in the base region 4a2. The base drawing region 4b1 contains arsenic or boron, for example, and is formed in the n+ type. An emitter region 6a2 is formed in the upper layer of the base region 4a2. The emitter region 6a2 contains boron, for example, and is formed in the p+ type. An emitter drawing electrode 7a2 comprised of the p-type polycrystalline silicon is electrically connected to the emitter region 6a2. The emitter width of the pnp-type unit transistor Qu2 is about 1 μm for example, which is larger than the emitter width of the npn-type unit transistor Qu1. The emitter width of the pnp-type unit transistor Qu2 is set to have the same electrical characteristics (i.e., the optimum current value) of the npn-type unit transistor Qu1. The emitter length of the unit transistor Qu2 is about 10 μm.

The first layer wiring M1 for the base is electrically connected to the base drawing region 4b1 through the contact hole CNT. The first layer wiring M1 for the emitter is electrically connected to the emitter drawing electrode 7a2 through the contact hole CNT. The first layer wiring M1 for the collector is electrically connected to the collector drawing region 3c2 through the contact hole CNT.

FIG. 21 illustrates a formation of the digital circuit using nMIS Qn and pMIS Qp. The nMIS Qn is formed on a p-well PWL of the semiconductor 1c, and has a semiconductor region 10 for the source and the drain, a gate insulation film 11, and a gate electrode 12. The semiconductor region 10 contains phosphorus or arsenic, and is formed in the n type. The semiconductor region 10 is electrically connected to the first layer wiring M1 through the contact hole CNT that is formed in the insulation film 8a. The pMIS Qp is formed on an n-well NWL of the semiconductor layer 1c, and has a semiconductor region 13 for the source and the drain, the gate insulation film 11, and the gate electrode 12. The semiconductor region 13 contains boron, for example, and is formed in the p type. The semiconductor region 13 is electrically connected to the first layer wiring M1 through the contact hole CNT that is formed in the insulation film 8a. The gate insulation film 11 comprises a silicon oxide film, for example. The gate electrode 12 has what is called a polycide structure that has a single film of polycrystalline silicon or has cobalt silicide (CoSix) formed on this single film.

One method of manufacturing the semiconductor device shown in FIG. 21 will be explained with reference to FIG. 22 to FIG. 25.

Figure 22:
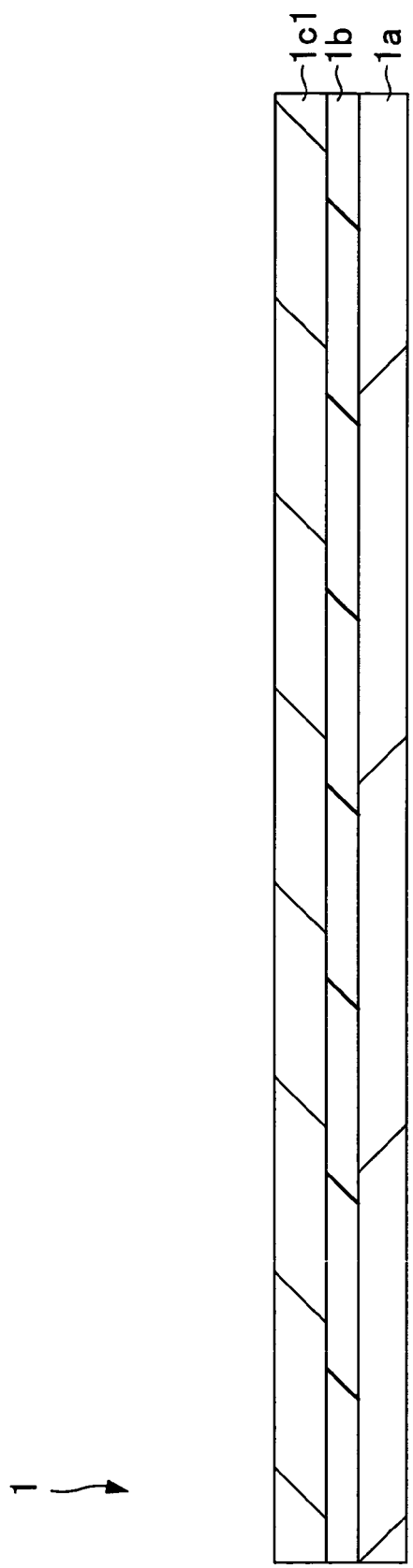
FIG. 22 is a cross-sectional view of a key portion of a wafer in a process of manufacturing the semiconductor device shown in FIG. 21.

First, the substrate shown in FIG. 22 is prepared. At this stage, the substrate 1 is in the state of a wafer having approximately a circular plane. A semiconductor layer 1c1 comprised of monocrystalline silicon having a thickness of about 1.0 to 20 μm is provided on the supporting substrate 1a comprised of the n-type silicon single crystal, for example, via the insulation layer 1b comprised of the silicon oxide film having a thickness of about 0.2 to 0.5 μm. This substrate 1 is formed according to a bonding method. Two semiconductor wafers (hereinafter referred to as a wafer) comprised of monocrystalline silicon are bonded together via the insulation layer 1b. After this, the rear surface of one of the wafers is ground to form the thin semiconductor layer 1c1 to form an element.

Figure 23:
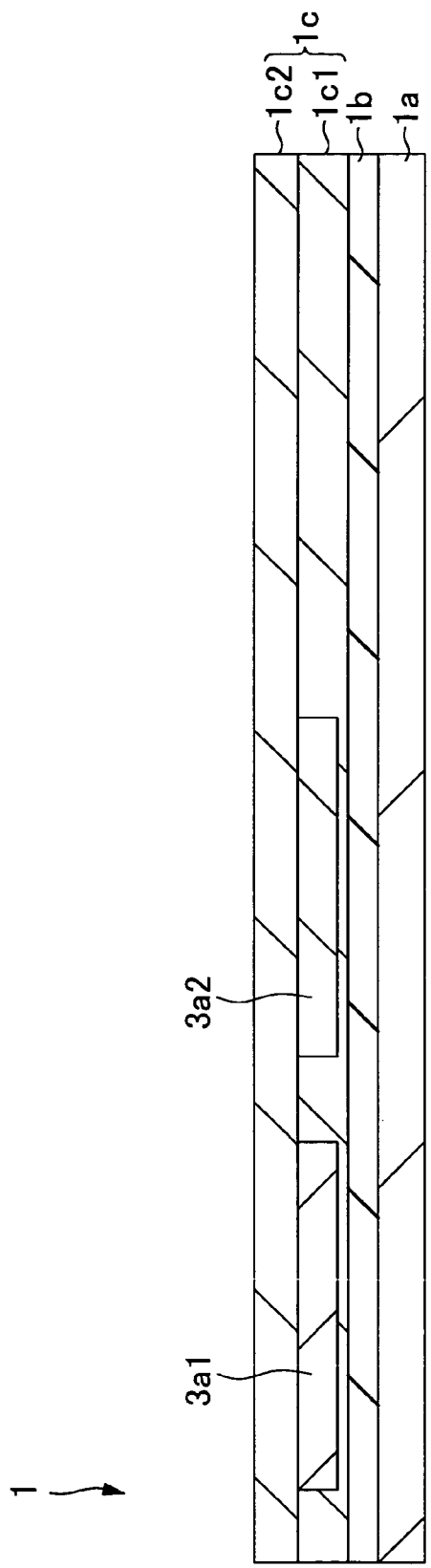
FIG. 23 is a cross-sectional view of the key portion of the wafer in the process of manufacturing the semiconductor device following the process shown in FIG. 22.

Next, as shown in FIG. 23, a conductive impurity (for example, antimony) that forms an n-type region and a conductive impurity (for example, boron) that forms a p-type region are selectively ion-injected using separate resist films as masks. Then, the result is heat treated to form an n-type embedded collector region 3a1 and a p-type embedded collector region 3a2. A semiconductor layer 1c2 comprised of monocrystalline silicon is formed on the semiconductor layer 1c1 according to an epitaxial method. The semiconductor layer 1c is formed based on the lamination of the semiconductor layers 1c1 and 1c2.

Figure 24:
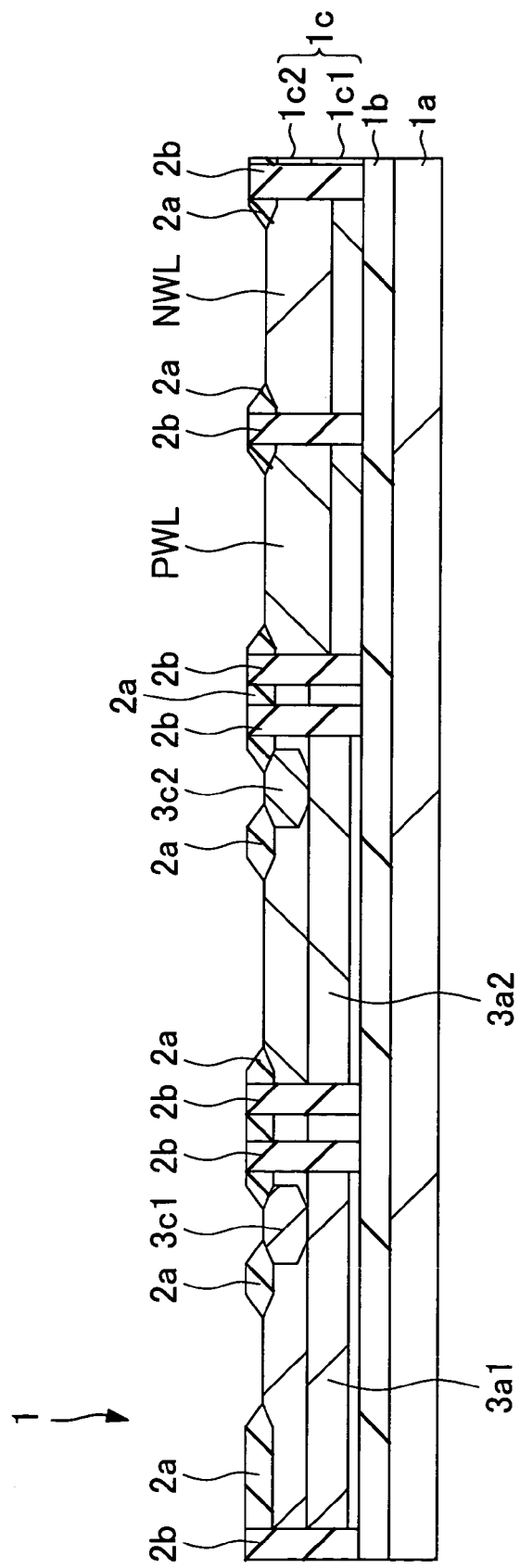
FIG. 24 is a cross-sectional view of the key portion of the wafer in the process of manufacturing the semiconductor device following the process shown in FIG. 23.

Then, as shown in FIG. 24, the shallow groove isolation 2a is formed on the main surface (i.e., the device formation surface) of the semiconductor layer 1c according to the LOCOS method. After this, a deep groove that reaches the insulation layer 1b is formed. Inside this groove, a silicon oxide film is embedded according to a CVD (Chemical Vapor Deposition) method or the like, thereby to form the deep trench isolation 2b. A thin silicon oxide film is formed on the main surface of the semiconductor layer 1c. A conductive impurity (for example, phosphorus) that forms an n-type region and a conductive impurity (for example, boron) that forms a p-type region are selectively ion-injected using separate resist masks, thereby to form the collector drawing regions 3c1 and 3c2. A conductive impurity (for example, phosphorus) that forms an n-type region on the pMIS formation region is ion-injected using resist film as a mask. A conductive impurity (for example, boron) that forms a p-type region on the nMIS formation region is ion-injected using a resist film as a mask. With this arrangement, the n-well NWL and the p-well PWL are formed.

Figure 25:
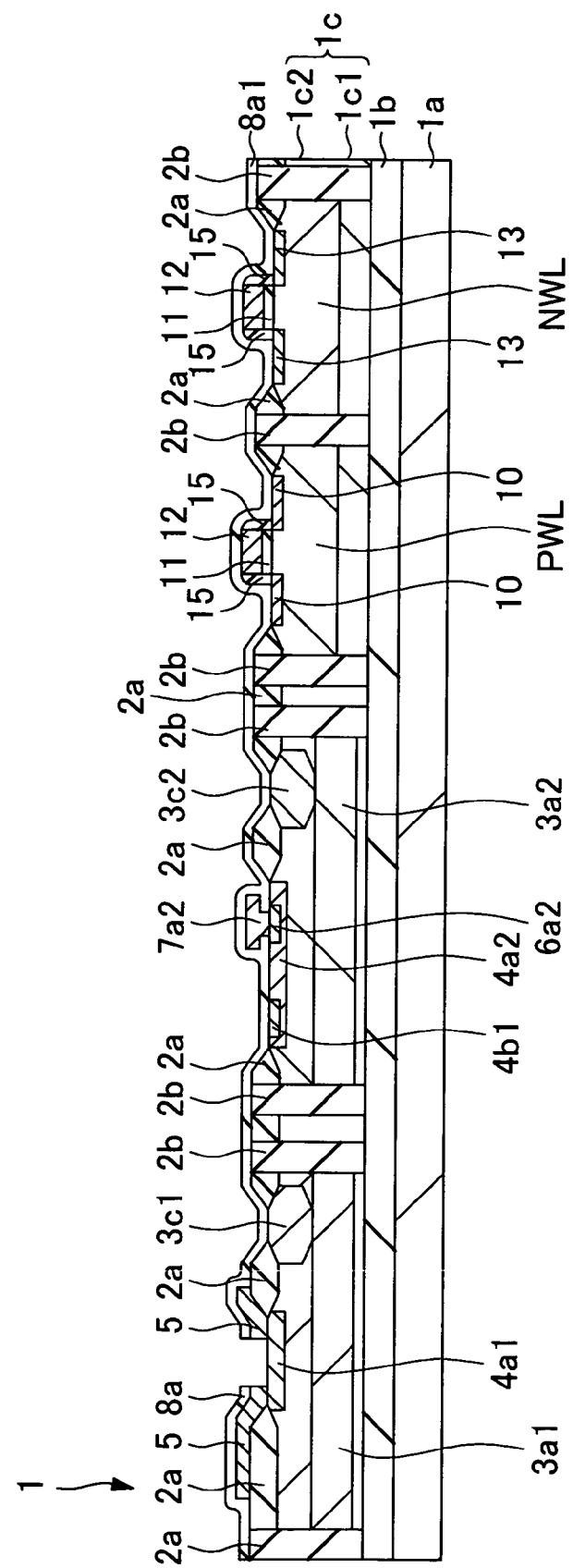
FIG. 25 is a cross-sectional view of the key portion of the wafer in the process of manufacturing the semiconductor device following the process shown in FIG. 24.

As shown in FIG. 25, an impurity for adjusting a threshold value voltage is introduced into channel formation regions of the nMIS formation region and the pMIS formation region, thereby to form the gate insulation film 11. The gate electrode 12 is formed on this gate insulation film 11. The gate insulation film 11 and the gate electrode 12 are formed simultaneously in the nMIS formation region and the pMIS formation region. Then, as shown in FIG. 25, the n-type base region 4a2 of the pnp-type transistor Q4 is formed according to the ion injection. A semiconductor region for the source and the drain of a low impurity density is formed in the nMIS formation region and the pMIS formation region. A side wall 15 comprised of a silicon oxide film or the like is formed on the side surface of the gate electrode 12. The semiconductor region 10 for the source and the drain of the nMIS Qn, the semiconductor region 13 for the source and the drain of the pMIS Qp, and the base drawing region 4b1 of the pnp-type transistor Q4 are formed according to the ion injection method. The semiconductor region 10 for the source and the drain of the nMIS Qn and the base drawing region 4b1 of the pnp-type transistor Q4 are formed in the same impurity introduction process.

Next, a p-type polycrystalline silicon film is deposited over the semiconductor layer 1c according to the CVD method or the like. This film is patterned using the photolithographic technique or the dry-etching technique, thereby to form a pattern of the base drawing electrode and the emitter drawing electrode 7a2. An insulation film 8a1 is deposited on the semiconductor layer 1c according to the CVD method or the like. Then, a position for forming a base region of a pattern of the base drawing electrode is removed by etching according to the photolithographic technique or the dry-etching technique. With this arrangement, an aperture is formed, and the base drawing electrode 5 is formed. 2-boron fluoride (BF$_2$) or the like is ion-injected into the semiconductor layer 1c that is exposed from the aperture, thereby to form the base region 4a1 in self-alignment relative to the based drawing electrode 5 within the npn-type transistor formation region. The impurity (boron) in the emitter drawing electrode 7a2 of the pnp-type transistor is thermally diffused into the semiconductor layer 1c, thereby to form the emitter region 6a2 in self-alignment within the base region 4a2. Then, a side wall insulation film is formed by oxidation or the like on the side surface of the aperture of the base drawing electrode 5. This side wall insulation film has a function of isolating the base drawing electrode 5 of the npn-type transistor from the emitter drawing electrode 7a1.

Next, an n-type polycrystalline silicon film is deposited over the semiconductor layer 1c according to the CVD method or the like. This film is patterned using the photolithographic technique or the dry-etching technique, thereby to form the emitter drawing electrode 7a1 shown in FIG. 6 in self-alignment relative to the base drawing electrode 5 and the base region 4a1. When the resistors Rb are also formed, the resistors Rb are formed at the same time as the patterning of the emitter drawing electrode 7a1. The resistance of the resistors Rb is set by selectively ion injecting the impurity before this patterning process. Then, the substrate 1 is heat treated to thermally diffuse the impurity in the emitter drawing electrode 7a1 to the semiconductor layer 1c, thereby to form the emitter region 6a1 in self alignment within the base region 4a1, as shown in FIG. 21. Thereafter, an insulation film comprised of a silicon oxide film, for example, is deposited over the semiconductor layer 1c. The top surface of this film is flattened to form the insulation film 8a. The contact hole CNT is formed in the insulation film 8a. Thereafter, a conductor film using aluminum as a main body is deposited by sputtering onto the main surface of the substrate 1. The film is patterned according to the photolithographic technique or the dry-etching technique, thereby to form the first layer wiring M1.

While the invention of the present inventors is explained in detail according to the embodiments, the present invention is not limited to these embodiments. It is needless to mention that the invention can be modified without departing from the spirit and scope of the invention.

For example, the method of manufacturing the substrate is not limited to the method of bonding wafers, and can be modified in various ways. For example, what is called an SIMOX (Separation by Implanted Oxygen) for forming an insulation layer by implanting an oxygen ion into a semiconductor device may be used.

While the wiring has a normal wiring structure in the above embodiments, the structure is not limited to this. For example, the wiring may have a structure according to a damascene method or a duel damascene method. In other words, according to the damascene method, a conductor film is embedded into an aperture for wiring such as a groove or a hole formed in the insulation film, thereby to form a wiring or a plug. According to the duel damascene method, the groove and the hole are embedded using the same conductor material in the same process.

In the above explanation, the invention of the present inventors is mainly applied to the analog-digital hybrid circuit as the background utilization field. However, the application is not limited to this. The invention can also be applied to a semiconductor device having the SOI substrate formed with bipolar transistors on which a memory circuit such as a DRAM (Dynamic Random Access Memory), an SRAM (Static Random Access Memory), or a flash memory (i.e., EEPROM: Electric Erasable Programmable Read Only Memory) is formed.

The following representative effect can be obtained from the present invention.

The thermal stability of the semiconductor device can be improved when the isolation surrounds one group or the whole of a plurality of the same kind of unit transistors that are disposed on the semiconductor layer on the insulation layer in a state that the transistors are connected in parallel.

What is claimed is:

1. A semiconductor device comprising:
a) a semiconductor layer that is provided over an insulator layer that is provided over a support substrate layer, said insulator layer having a lower thermal conductivity than the semiconductor layer;
b) a plurality of bipolar transistors that are provided on the semiconductor layer such that collectors, emitters and bases of the bipolar transistors are respectively connected in parallel with each other; and
c) an isolation that is provided over a main surface of the semiconductor layer and that is constructed to have a depth that does not reach through to the insulator layer and also does not reach the support substrate layer;
wherein one of a portion and a whole of the plurality of bipolar transistors are surrounded by the insulator layer, the isolation, and an oxide film disposed within the isolation so as to not reach the support substrate layer, and
wherein the surrounded portion or whole of the plurality of transistors operates substantially uniformly as constituent elements of a unit transistor.

2. The semiconductor device according to claim 1, wherein resistors are electrically connected to the emitters of the plurality of bipolar transistors, respectively.

3. The semiconductor device according to claim 2, wherein each resistor is comprised of polycrystalline silicon.

4. The semiconductor device according to claim 1, wherein a distance between a contact hole for a base and a contact hole for a collector of mutually adjacent bipolar transistors is a minimum distance between the transistors.

5. The semiconductor device according to claim 1, wherein a distance between a contact hole for a base and a contact hole for a collector of mutually adjacent bipolar transistors is 1 μm or more.

6. A semiconductor device comprising:
a) a semiconductor layer that is provided over an insulator layer that is provided over a support substrate layer, said insulator layer having a lower thermal conductivity than the semiconductor layer;
b) a plurality of bipolar transistors that are provided on the semiconductor layer such that collectors, emitters and bases of the bipolar transistors are respectively connected in parallel with each other;
c) resistors which are electrically connected to corresponding ones of the plurality of bipolar transistors; and
d) an isolation that is provided over the main surface of the semiconductor layer and that is constructed to have a depth that does not reach through to the insulator layer and also does not reach the support substrate layer;
wherein one of a portion and a whole of the plurality of bipolar transistors are surrounded by the insulator layer, the isolation, and an oxide film disposed within the isolation so as to not reach the support substrate layer, and
wherein the surrounded portion or whole of the plurality of transistors operates substantially uniformly as constituent elements of a unit transistor.

7. The semiconductor device according to claim 6, wherein each resistor is comprised of polycrystalline silicon.

8. The semiconductor device according to claim 6, wherein a distance between a contact hole for a base and a contact hole for a collector of mutually adjacent bipolar transistors is a minimum distance between the transistors.

9. The semiconductor device according to claim 6, wherein a distance between a contact hole for a base and a contact hole for a collector of mutually adjacent bipolar transistors is 1 μm or more.

10. A semiconductor device comprising:
a) a semiconductor layer that is provided over an insulator layer that is provided over a support substrate layer, said insulator layer having a lower thermal conductivity than the semiconductor layer;
b) a plurality of first bipolar transistors that are provided in a first region over a portion of the semiconductor layer such that collectors of the first bipolar transistors are connected in parallel with each other, emitters of the first bipolar transistors are connected in parallel with each other, and bases of the first bipolar transistors are connected in parallel with each other;

c) a first isolation provided over the main surface of the semiconductor layer and that is constructed to have a depth that does not reach through to the insulator layer and also does not reach the support substrate layer;

d) a plurality of second bipolar transistors that are provided in a second region over a portion of the semiconductor layer such that collectors of the second bipolar transistors are connected in parallel with each other, emitters of the second bipolar transistors are connected in parallel with each other, and bases of the second bipolar transistors are connected in parallel with each other; and e) a second isolation that is provided over the main surface of the semiconductor layer that is constructed to have a depth that does not reach through to the insulator layer and also does not reach the support substrate layer;

wherein one of a portion and a whole of the plurality of first bipolar transistors are surrounded by the insulator layer, the first isolation in the first region, and an oxide film disposed within the first isolation so as to not reach the support substrate layer, wherein the surrounded portion or whole of the plurality of first transistors operates substantially uniformly as constituent elements of a first unit transistor, wherein one of a portion and a whole of the plurality of second bipolar transistors are surrounded by the insulator layer, the second isolation in the second region, and an oxide film disposed within the second isolation so as to not reach the support substrate layer, and wherein the surrounded portion or whole of the plurality of second transistors operates substantially uniformly as constituent elements of a second unit transistor.

11. The semiconductor device according to claim 10, wherein
resistors are electrically connected to the emitters of the plurality of the first and second bipolar transistors, respectively.

12. The semiconductor device according to claim 11, wherein
each resistor is comprised of polycrystalline silicon.

13. The semiconductor device according to claim 10, wherein
a distance between a contact hole for a base and a contact hole for a collector of mutually adjacent first bipolar transistors is a minimum distance between the transistors.

14. The semiconductor device according to claim 10, wherein
a distance between a contact hole for a base and a contact hole for a collector of mutually adjacent bipolar transistors is 1 µm or more.

15. The semiconductor device according to claim 10, wherein
a distance between a contact hole for a base and a contact hole for a collector of mutually adjacent first bipolar transistors is equal to a distance between a contact hole for a base and a contact hole for a collector of mutually adjacent second bipolar transistors.

16. The semiconductor device according to claim 10, wherein
an optimum current value of the first bipolar transistor is larger than an optimum current value of the second bipolar transistor.

17. The semiconductor device according to claim 16, wherein
a permissible maximum current value of the first bipolar transistor is larger than a permissible maximum current value of the second bipolar transistor by 1.5 times or more.

18. The semiconductor device according to claim 10, wherein
the first bipolar transistor constitutes a circuit that requires a heat radiation characteristic that is larger than a heat radiation characteristic of the second bipolar transistor, and the second bipolar transistor constitutes a circuit that requires a higher speed than that of the first bipolar transistor.

* * * * *